(12) United States Patent
Zhang et al.

(10) Patent No.: US 11,018,827 B2
(45) Date of Patent: May 25, 2021

(54) INFORMATION TRANSMISSION METHOD AND APPARATUS

(71) Applicant: Huawei Technologies Co., Ltd., Guangdong (CN)

(72) Inventors: Zhaoyang Zhang, Hangzhou (CN); Xianbin Wang, Hangzhou (CN); Yu Zhang, Hangzhou (CN); Yiqun Wu, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 149 days.

(21) Appl. No.: 16/200,355

(22) Filed: Nov. 26, 2018

(65) Prior Publication Data

US 2019/0097769 A1 Mar. 28, 2019

Related U.S. Application Data

(63) Continuation of application No. PCT/CN2017/086033, filed on May 26, 2017.

(30) Foreign Application Priority Data

May 27, 2016 (CN) .......................... 201610368154.5

(51) Int. Cl.
*H04L 5/00* (2006.01)
*H04L 25/02* (2006.01)
(Continued)

(52) U.S. Cl.
CPC .......... *H04L 5/005* (2013.01); *H03M 13/136* (2013.01); *H04L 5/0048* (2013.01);
(Continued)

(58) Field of Classification Search
CPC ... H04L 5/005; H04L 25/0226; H04L 5/0048; H04L 5/0091; H04L 27/2613;
(Continued)

(56) References Cited

U.S. PATENT DOCUMENTS 9,197,367 B2 11/2015 Yamada et al.
2011/0299482 A1 12/2011 Seo et al.
(Continued)

FOREIGN PATENT DOCUMENTS

CN 1494332 A 5/2004
CN 101488823 A 7/2009
(Continued)

OTHER PUBLICATIONS

Ni et al., Using Reed-Muller Sequences as Deterministic Compressed Sensing Matrices for Image Reconstruction, 2010 (Year: 2010).*
(Continued)

*Primary Examiner* — Justin T Van Roie
(74) *Attorney, Agent, or Firm* — Kilpatrick Townsend & Stockton LLP

(57) ABSTRACT

Embodiments of this application provide an information transmission method and an apparatus, to improve transmission reliability. The method includes: obtaining, by a terminal device, a to-be-sent pilot sequence, where the to-be-sent pilot sequence is a Reed-Muller sequence; and sending, by the terminal device, the to-be-sent pilot sequence.

10 Claims, 9 Drawing Sheets

(51) Int. Cl.
  *H04L 27/26* (2006.01)
  *H03M 13/13* (2006.01)
  *H04W 74/08* (2009.01)

(52) U.S. Cl.
  CPC .......... *H04L 5/0055* (2013.01); *H04L 5/0091* (2013.01); *H04L 25/0204* (2013.01); *H04L 25/0226* (2013.01); *H04L 27/2613* (2013.01); *H04W 74/08* (2013.01); *H04L 5/0032* (2013.01)

(58) Field of Classification Search
  CPC . H04L 5/0055; H04L 25/0204; H04L 5/0032; H04L 5/0094; H03M 13/136; H04W 74/08
  See application file for complete search history.

(56) References Cited

U.S. PATENT DOCUMENTS

| | | | |
|---|---|---|---|
| 2012/0203810 | A1 | 8/2012 | Ashikhmin |
| 2015/0043470 | A1 | 2/2015 | Hwang et al. |

FOREIGN PATENT DOCUMENTS

| | | |
|---|---|---|
| CN | 104468022 A | 3/2015 |
| WO | 2004040772 A1 | 5/2004 |

OTHER PUBLICATIONS

Qualcomm Incorporated, "Remaining details of Uplink Reference Signal Design," R1-163016, 3GPP TSG RAN WG1 Meeting #84bis, Busan, Korea, Apr. 11-15, 2016, 7 pages, XP51080746.
Radomir S. Stankovic et al., "A Discussion on the History of Research in Arithmetic and Reed-Muller Expressions," IEEE Transactions on Computer-Aided Design of Integrated Circuits and Systems, vol. 20, No. 9, Sep. 2001, 3 pages.
S. D. Howard et al., "A Fast Reconstruction Algorithm for Deterministic Compressive Sensing using Second Order Reed-Muller Codes," 2008 IEEE , 5 pages.
Ge Bai et al., "Golay Complementary Sequences and Reed-Muller Codes Based PAPR Reduction for Relay Networks with Superimposed Training," ICSP2012 Proceedings, 2012 IEEE, 4 pages.
David L. Donoho and Jared Tanner, "Neighborliness of Randomly-Projected Simplices in High Dimensions," Mar. 2005, 16 pages.
J. D. Key, "Some Applications of Magma in Designs and Codes: Oval Designs, Hermitian Unitals and Generalized Reed-Muller Codes," J. Symbolic Computation (2001) 31, 37-53, 17 pages.
Qualcomm Incorporated: "UL Data Channel design", 3 GPP Draft; R1-161117, vol. RAN WG1, No. St Julian"s, Malta; Feb. 14, 2016, XP051064556, 11 pages.
Esmaeili M et al: "Acyclic Tanner graphs and maximum-likelihood decoding of linear block codes", IEE Proceedings: Communications, Institution of Electrical Engineers, GB, vol. 147, No. 6, Dec. 11, 2000, pp. 322-332, XP006013995.

\* cited by examiner $H=$ $$\begin{bmatrix} 0.3536 & -0.3536 & -0.3536 & 0.3536 & -0.3536 & 0.3536 & 0.3536 & -0.3536 \\ 0.3536 & 0.3536 & -0.3536 & -0.3536 & -0.3536 & -0.3536 & 0.3536 & 0.3536 \\ 0.3536 & -0.3536 & 0.3536 & -0.3536 & -0.3536 & 0.3536 & -0.3536 & 0.3536 \\ 0.3536 & 0.3536 & 0.3536 & 0.3536 & -0.3536 & -0.3536 & -0.3536 & -0.3536 \\ 0.3536 & -0.3536 & -0.3536 & 0.3536 & 0.3536 & -0.3536 & -0.3536 & 0.3536 \\ 0.3536 & 0.3536 & -0.3536 & -0.3536 & 0.3536 & 0.3536 & -0.3536 & -0.3536 \\ 0.3536 & -0.3536 & 0.3536 & -0.3536 & 0.3536 & -0.3536 & 0.3536 & -0.3536 \\ 0.3536 & 0.3536 & 0.3536 & 0.3536 & 0.3536 & 0.3536 & 0.3536 & 0.3536 \end{bmatrix}$$

INFORMATION TRANSMISSION METHOD AND APPARATUS

CROSS-REFERENCE TO RELATED APPLICATIONS

This application is a continuation of International Patent Application No. PCT/CN2017/086033, filed on May 26, 2017, which claims priority to Chinese Patent Application No. 201610368154.5, filed on May 27, 2016. The disclosures of the aforementioned applications are hereby incorporated by reference in their entireties.

TECHNICAL FIELD

This application relates to the communications field, and more specifically, to an information transmission method and an apparatus.

BACKGROUND

In a typical wireless communications network (for example, Long Term Evolution (LTE)), selection of an uplink shared channel is based on a scheduling/grant mechanism and is completely controlled by a base station (BS). In the mechanism, user equipment (UE) first sends an uplink scheduling request to the BS. After receiving the request, the BS sends an uplink grant to the UE, to inform the UE of an uplink transmission resource allocated to the UE. Accordingly, the UE transmits data on the granted uplink transmission resource.

Massive user access is one of typical application scenarios of a next-generation communications network. During massive user access, using the foregoing scheduling/grant mechanism not only causes enormous signaling transmission overheads and resource allocation scheduling pressure of a BS, but also results in a considerable transmission latency. In view of this, the next-generation communications network uses a grant-free transmission mode to support massive user access.

In the foregoing grant-free transmission for massive user access, because a plurality of UEs are allowed to perform contention-based transmission on a same time-frequency resource, a contention-caused collision occurs, thereby reducing grant-free transmission reliability.

SUMMARY

Embodiments of this application provide an information transmission method, a terminal device, a network device, and a storage medium, to improve transmission reliability.

According to a first aspect, an information transmission method is provided, including: obtaining, by a terminal device, a to-be-sent pilot sequence, where the to-be-sent pilot sequence is a Reed-Muller sequence; and sending, by the terminal device, the to-be-sent pilot sequence.

With reference to the first aspect, in a first possible implementation of the first aspect, the method is applied to grant-free transmission.

In this application, a pilot sequence is implemented by using a Reed-Muller sequence. In this way, a large quantity of sequences can be generated, and different sequences are closely correlated. Therefore, grant-free transmission reliability can be improved.

With reference to the first aspect or the first possible implementation of the first aspect, in a second possible implementation of the first aspect, the to-be-sent pilot sequence is generated according to a Reed-Muller sequence generation formula.

With reference to the second possible implementation of the first aspect, in a third possible implementation of the first aspect, the to-be-sent pilot sequence is an order-2 Reed-Muller sequence generated according to a formula $$\phi_{P,b}(a) = \frac{1}{\sqrt{2^m}} i^{(2b+pb)^T a},$$

where a length of the pilot sequence is $2^m$ and m is a positive integer; p is a matrix of m rows and m columns; b is a vector of m rows; a is a bit vector with a length of m and consisting of 0s and 1s, has a total of $2^m$ possible values, and is corresponding to $2^m$ elements of the pilot sequence; and $i^2 = -1$.

Optionally, when a Reed-Muller sequence is generated according to the order-2 sequence generation formula, a value of p may be 0.

With reference to any one of the first aspect or the foregoing possible implementations of the first aspect, in a fourth possible implementation of the first aspect, the obtaining, by a terminal device, a to-be-sent pilot sequence is specifically: obtaining, by the terminal device, the to-be-sent pilot sequence from a pilot sequence set, where the pilot sequence set includes at least two Reed-Muller sequences.

The to-be-sent pilot sequence may be selected from the pilot sequence set randomly or based on a pilot index. For example, the pilot index may be generated by using a random number generator. For example, different initial values may be set for a pseudo-noise (Pseudo-noise, PN) sequence to generate different random number sequences, so that the pilot index is obtained accordingly. A possible method for selecting the initial value is based on at least one of an identifier of the terminal, a system frame number, a timeslot number, and a cell identifier. The system frame number may be a sequence number of a frame in which a target pilot sequence is to be transmitted, the timeslot number may be a number of a timeslot in which the target pilot sequence is to be transmitted, and the cell identifier may be an identifier of a cell in which the terminal device is located.

With reference to the third possible implementation of the first aspect, in a fifth possible implementation of the first aspect, the obtaining, by a terminal device, a to-be-sent pilot sequence is specifically: determining the length of the to-be-sent pilot sequence, where the length of the to-be-sent pilot sequence is $2^m$ and m is a positive integer; determining the matrix p of m rows and m columns and the vector b of m rows; and generating an order-2 Reed-Muller sequence as the to-be-sent pilot sequence according to the formula $$\phi_{P,b}(a) = \frac{1}{\sqrt{2^m}} i^{(2b+pb)^T a}.$$

With reference to the fifth possible implementation of the first aspect, in a sixth possible implementation of the first aspect, before the obtaining, by a terminal device, a to-be-sent pilot sequence, the method further includes: receiving, by the terminal device, first indication information sent by a network device, where the first indication information is used to indicate the length of the to-be-sent pilot sequence;

and the determining the length of the to-be-sent pilot sequence is specifically: determining the length of the to-be-sent pilot sequence based on indication of the first indication information.

Optionally, different pilot sequence lengths may be corresponding to sets having different quantities of elements. In other words, a matrix p set and a vector b set may be determined based on a pilot sequence length, and the matrix p and the vector b may be selected from the matrix p set and the vector b set, respectively.

With reference to the fifth possible implementation of the first aspect, in a seventh possible implementation of the first aspect, the determining the length of the to-be-sent pilot sequence is specifically: determining the length of the to-be-sent pilot sequence based on a size of a to-be-used time-frequency resource.

With reference to any one of the fifth to the seventh possible implementations of the first aspect, in an eighth possible implementation of the first aspect, the matrix p is a binary symmetric matrix.

With reference to any one of the fourth to the eighth possible implementations of the first aspect, in a ninth possible implementation of the first aspect, the determining the matrix p of m rows and m columns and the vector b of m rows is specifically: selecting the matrix p from a matrix p set corresponding to m; and selecting the vector b from a vector b set corresponding to m.

The matrix p set includes a plurality of matrices p of m rows and m columns. The vector b of m rows may be selected from the vector b set, where the vector b set includes a plurality of vectors b of m rows.

With reference to the ninth possible implementation of the first aspect, in a tenth possible implementation of the first aspect, the matrix p in the matrix p set is a binary symmetric matrix whose diagonal consists of 0s, and each element of the matrix p is 0 or 1; and/or the vector b in the vector b set is a binary vector, and each element of the vector b is 0 or 1.

With reference to the ninth or the tenth possible implementation of the first aspect, in an eleventh possible implementation of the first aspect, the method further includes: generating a pilot index based on at least one of an identifier of the terminal device, a system frame number, a timeslot number, and a cell identifier; the selecting the matrix p is specifically: selecting, based on the pilot index, the matrix p from the matrix p set corresponding to m; and the selecting the vector b is specifically: selecting, based on the pilot index, the vector b from the vector b set corresponding to m.

With reference to any one of the ninth to the eleventh possible implementations of the first aspect, in a twelfth possible implementation of the first aspect, the method further includes: receiving, by the terminal device, second indication information sent by the network device, where the second indication information is used to indicate the matrix p set and/or the vector b set, so that based on indication of the second indication information, the terminal device can select the matrix p from the matrix p set indicated by the second indication information, and select the vector b from the vector b set indicated by the second indication information.

According to a second aspect, an information transmission method is provided, including: obtaining, by a network device, a received signal, where the received signal includes a pilot sequence of at least one terminal device, and the pilot sequence is a Reed-Muller sequence; and obtaining the pilot sequence of the at least one terminal device from the received signal.

With reference to the second aspect, in a first possible implementation of the second aspect, the pilot sequence is an order-2 Reed-Muller sequence generated according to a formula $$\phi_{P,b}(a) = \frac{1}{\sqrt{2^m}} i^{(2b+pb)^T a},$$

where a length of the pilot sequence is $2^m$ and m is a positive integer; p is a matrix of m rows and m columns; b is a vector of m rows; a is a bit vector with a length of m and consisting of 0s and 1s, has a total of $2^m$ possible values, and is corresponding to $2^m$ elements of the pilot sequence; and $i^2=-1$.

With reference to the second aspect or the foregoing possible implementation of the second aspect, in a second possible implementation of the second aspect, before the obtaining, by a network device, a received signal, the method further includes: sending, by the network device, first indication information to the terminal device, where the first indication information is used to indicate a length of a to-be-sent pilot sequence.

With reference to any one of the second aspect or the foregoing possible implementations of the second aspect, in a third possible implementation of the second aspect, before the obtaining, by a network device, a received signal, the method further includes: sending, by the network device, second indication information to the terminal device, where the second indication information is used to indicate a vector b set and a matrix p set, the vector b set is used by the terminal device to select the vector b, and the matrix p set is used by the terminal device to select the matrix p, so that based on indication of the second indication information, the terminal device can select the matrix p from the matrix p set indicated by the second indication information, and select the vector b from the vector b set indicated by the second indication information.

With reference to any one of the second aspect or the foregoing possible implementations of the second aspect, in a fourth possible implementation of the second aspect, the method further includes: detecting, based on a pilot sequence of each terminal device, data sent by the terminal device; and sending an acknowledgment feedback message to the terminal device when the data is successfully decoded; or sending a negative acknowledgment feedback message to the terminal device when the data is unsuccessfully decoded.

According to a third aspect, an information transmission method is provided, where the method includes: obtaining, by a terminal device, a to-be-sent pilot sequence, where the to-be-sent pilot sequence is a sequence generated according to a formula $$\phi_{P,b}(a) = \frac{1}{\sqrt{2^m}} i^{(2b+pb)^T a},$$

where a length of the pilot sequence is $2^m$ and m is a positive integer; p is a matrix of m rows and m columns; b is a vector of m rows; a is a bit vector with a length of m and consisting of 0s and 1s, has a total of $2^m$ possible values, and is corresponding to $2^m$ elements of the pilot sequence; and $i^2=-1$; and sending, by the terminal device, the to-be-sent pilot sequence.

With reference to the third aspect, in a first possible implementation of the third aspect, the terminal device obtains the to-be-sent pilot sequence from a pilot sequence set, where the pilot sequence set includes at least two sequences.

With reference to the third aspect or the foregoing possible implementation of the third aspect, in a second possible implementation of the third aspect, the length of the to-be-sent pilot sequence is determined, where the length of the to-be-sent pilot sequence is $2^m$ and m is a positive integer; the matrix p of m rows and m columns and the vector b of m rows are determined; and a sequence is generated as the to-be-sent pilot sequence according to the formula $$\phi_{p,b}(a) = \frac{1}{\sqrt{2^m}} i^{(2b+pb)^T a}.$$

With reference to any one of the third aspect or the foregoing possible implementations of the third aspect, in a third possible implementation of the third aspect, first indication information sent by a network device is received, where the first indication information is used to indicate the length of the to-be-sent pilot sequence; and the length of the to-be-sent pilot sequence is determined based on indication of the first indication information.

With reference to any one of the third aspect or the foregoing possible implementations of the third aspect, in a fourth possible implementation of the third aspect, the terminal device selects the matrix p from a matrix p set corresponding to m, and selects the vector b from a vector b set corresponding to m.

With reference to any one of the third aspect or the foregoing possible implementations of the third aspect, in a fifth possible implementation of the third aspect, the matrix in the matrix p set is a binary symmetric matrix whose diagonal consists of 0s, and each element of the matrix is 0 or 1; and/or the vector in the vector b set is a binary vector, and each element of the vector is 0 or 1.

With reference to any one of the third aspect or the foregoing possible implementations of the third aspect, in a sixth possible implementation of the third aspect, a pilot index is generated based on at least one of an identifier of the terminal device, a system frame number, a timeslot number, and a cell identifier; based on the pilot index, the matrix p is selected from the matrix p set corresponding to m; and based on the pilot index, the vector b is selected from the vector b set corresponding to m.

With reference to any one of the third aspect or the foregoing possible implementations of the third aspect, in a seventh possible implementation of the third aspect, second indication information sent by the network device is received, where the second indication information is used to indicate the matrix p set and/or the vector b set.

According to a fourth aspect, an information transmission method is provided, where the method includes: obtaining a received signal, where the received signal includes a pilot sequence sent by at least one terminal device, and the pilot sequence is a sequence generated according to a formula $$\phi_{p,b}(a) = \frac{1}{\sqrt{2^m}} i^{(2b+pb)^T a},$$

where a length of the pilot sequence is $2^m$ and m is a positive integer; p is a matrix of m rows and m columns; b is a vector of m rows; a is a bit vector with a length of m and consisting of 0s and 1s, has a total of $2^m$ possible values, and is corresponding to $2^m$ elements of the pilot sequence; and $i^2=-1$; and obtaining the pilot sequence sent by the at least one terminal device from the received signal.

With reference to the fourth aspect, in a first possible implementation of the fourth aspect, a network device sends first indication information to the terminal device, where the first indication information is used to indicate a length of a to-be-sent pilot sequence.

With reference to the fourth aspect or the first possible implementation of the fourth aspect, in a second possible implementation of the fourth aspect, the network device sends second indication information to the terminal device, where the second indication information is used to indicate a vector b set and a matrix p set, the vector b set is used by the terminal device to select the vector b, and the matrix p set is used by the terminal device to select the matrix p.

According to a fifth aspect, a terminal device is provided, configured to perform the method according to any one of the first aspect or the possible implementations of the first aspect. Specifically, the terminal device includes modules or units configured to perform the method according to any one of the first aspect or the possible implementations of the first aspect.

According to a sixth aspect, a network device is provided, configured to perform the method according to any one of the second aspect or the possible implementations of the second aspect. Specifically, the network device includes modules or units configured to perform the method according to any one of the second aspect or the possible implementations of the second aspect.

According to a seventh aspect, a terminal device is provided, configured to perform the method according to any one of the third aspect or the possible implementations of the third aspect. Specifically, the terminal device includes modules or units configured to perform the method according to any one of the third aspect or the possible implementations of the third aspect.

According to an eighth aspect, a network device is provided, configured to perform the method according to any one of the fourth aspect or the possible implementations of the fourth aspect. Specifically, the network device includes modules or units configured to perform the method according to any one of the fourth aspect or the possible implementations of the fourth aspect.

According to a ninth aspect, a terminal device is provided, including a memory and a processor, where the memory is configured to store an instruction; the processor is configured to execute the instruction stored in the memory; and when the processor executes the instruction stored in the memory, the execution causes the processor to perform the method according to any one of the first aspect or the possible implementations of the first aspect.

According to a tenth aspect, a network device is provided, including a memory and a processor, where the memory is configured to store an instruction; the processor is configured to execute the instruction stored in the memory; and when the processor executes the instruction stored in the memory, the execution causes the processor to perform the method according to any one of the second aspect or the possible implementations of the second aspect.

According to an eleventh aspect, a terminal device is provided, including a memory and a processor, where the memory is configured to store an instruction; the processor is configured to execute the instruction stored in the memory; and when the processor executes the instruction stored in the memory, the execution causes the processor to perform the method according to any one of the third aspect or the possible implementations of the third aspect.

According to a twelfth aspect, a network device is provided, including a memory and a processor, where the memory is configured to store an instruction; the processor is configured to execute the instruction stored in the memory; and when the processor executes the instruction stored in the memory, the execution causes the processor to perform the method according to any one of the fourth aspect or the possible implementations of the fourth aspect.

According to a thirteenth aspect, a computer storage medium is provided, where the computer storage medium stores program code, and the program code is used to instruct to perform the method according to any one of the first aspect or the possible implementations of the first aspect.

According to a fourteenth aspect, a computer storage medium is provided, where the computer storage medium stores program code, and the program code is used to instruct to perform the method according to any one of the second aspect or the possible implementations of the second aspect.

According to a fifteenth aspect, a computer storage medium is provided, where the computer storage medium stores program code, and the program code is used to instruct to perform the method according to any one of the third aspect or the possible implementations of the third aspect.

According to a sixteenth aspect, a computer storage medium is provided, where the computer storage medium stores program code, and the program code is used to instruct to perform the method according to any one of the fourth aspect or the possible implementations of the fourth aspect.

DESCRIPTION OF EMBODIMENTS

Figures 1, 2:
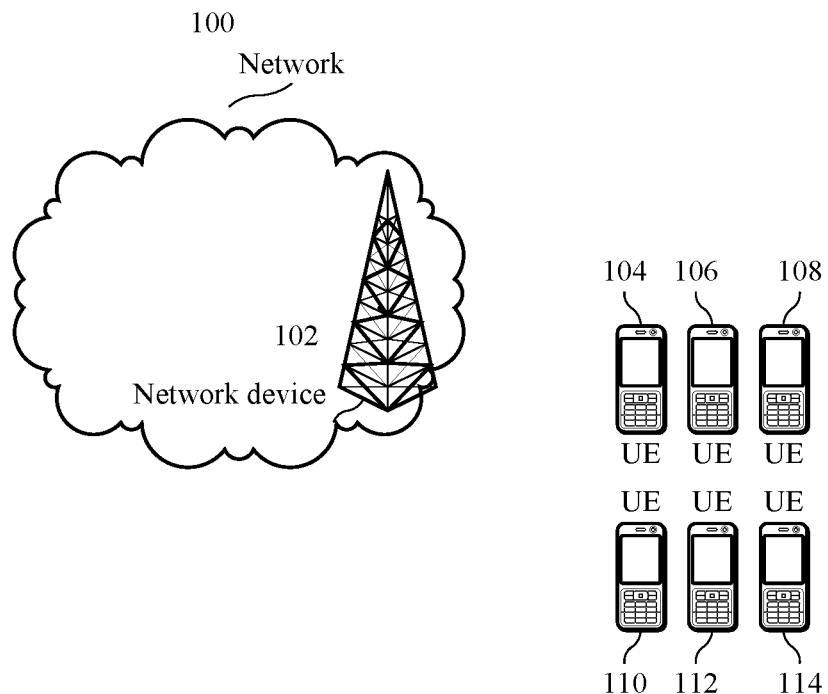
FIG. 1 is a diagram of an application scenario according to an embodiment of this application.
FIG. 2 is a schematic diagram of a Reed-Muller sequence according to an embodiment of this application.

The following describes the technical solutions in the embodiments of this application with reference to the accompanying drawings in the embodiments of this application.

The terms such as "component", "module", and "system" used in this specification are used to indicate computer-related entities, hardware, firmware, combinations of hardware and software, software, or software being executed. For example, a component may be but is not limited to a process that runs on a processor, a processor, an object, an executable file, a thread of execution, a program, and/or a computer. As shown in figures, both a computing device and an application that runs on a computing device may be components. One or more components may reside within a process and/or a thread of execution, and a component may be located on one computer and/or distributed between two or more computers. In addition, these components may be executed from various computer-readable media that store various data structures. For example, the components may communicate by using a local and/or remote process and according to, for example, a signal having one or more data packets (for example, data from one component interacting with another component in a local system, a distributed system, and/or across a network such as the Internet interacting with other systems by using the signal).

It should be understood that, the technical solutions in the embodiments of this application may be applied to various communications systems, for example, a Global System for Mobile Communications (GSM) system, a Code Division Multiple Access (CDMA) system, a Wideband Code Division Multiple Access (WCDMA) system, a Long Term Evolution (LTE) system, an LTE frequency division duplex (FDD) system, an LTE time division duplex (TDD) system, a Universal Mobile Telecommunications System (UMTS), and a future 5G communications system.

This application describes the embodiments with reference to a terminal device. The terminal device may also be referred to as user equipment (UE), an access terminal, a subscriber unit, a subscriber station, a mobile station, a mobile console, a remote station, a remote terminal, a mobile device, a user terminal, a terminal, a wireless communications device, a user agent, or a user apparatus. The access terminal may be a cellular phone, a cordless telephone set, a Session Initiation Protocol (SIP) phone, a wireless local loop (WLL) station, a personal digital assistant (PDA), a handheld device having a wireless communication function, a computing device, another processing device connected to a wireless modem, an in-vehicle device, a wearable device, a terminal device in a future 5G network, a terminal device in a future evolved PLMN network, or the like.

This application describes the embodiments with reference to a network device. The network device may be a device configured to communicate with a terminal device. For example, the network device may be a base transceiver station (BTS) in a GSM system or CDMA, may be a NodeB (NB) in a WCDMA system, or may be an evolved NodeB (eNB or eNodeB) in an LTE system. Alternatively, the network device may be a relay node, an access point, an in-vehicle device, a wearable device, a network-side device in a future 5G network, or a network device in a future evolved PLMN network.

Due to existence of a large quantity of connections, there is a significant difference between a future wireless communications system and an existing communications system. Because of the large quantity of connections, more resources need to be consumed for UE access, and more resources need to be consumed for scheduling signaling transmission related to data transmission of a terminal device.

FIG. 1 is a schematic architecture diagram of a communications system to which an embodiment of this application is applied. As shown in FIG. 1, the communications system 100 may include a network device 102 and terminal devices 104 to 114 (referred to as UE for short in the figure). The network device 102 and the terminal devices 104 to 114 are connected in a wireless manner, a wired manner, or another manner.

A network in this embodiment of this application may be a public land mobile network (PLMN), a D2D network, an M2M network, or another network. FIG. 1 is merely an example of a simplified schematic diagram. The network may further include another network device that is not shown in FIG. 1.

This application proposes a grant-free transmission solution. The grant-free transmission can adapt to a large quantity of MTC-type services in a future network and satisfy ultra-reliable and low-latency service transmission. The grant-free transmission may be used for uplink data transmission. A person skilled in the art can know that the grant-free transmission may have other names, such as spontaneous access, spontaneous multiple access, or contention-based multiple access. The grant-free transmission may be understood as including but not limited to any one or more of the following meanings, or a combination of some technical features in a plurality of the following meanings.

1. The grant-free transmission may mean: A network device pre-allocates a plurality of transmission resources to a terminal device and informs the terminal device of the plurality of transmission resources; when the terminal device has an uplink data transmission requirement, the terminal device selects at least one transmission resource from the plurality of transmission resources pre-allocated by the network device, and sends uplink data by using the selected transmission resource; and the network device detects, on one or more of the plurality of pre-allocated transmission resources, the uplink data sent by the terminal device. The detection may be blind detection, detection that is performed based on a control field in the uplink data, or detection performed in another manner.

2. The grant-free transmission may mean: A network device pre-allocates a plurality of transmission resources to a terminal device and informs the terminal device of the plurality of transmission resources, so that when the terminal device has an uplink data transmission requirement, the terminal device selects at least one transmission resource from the plurality of transmission resources pre-allocated by the network device, and sends uplink data by using the selected transmission resource.

3. The grant-free transmission may mean: Information about a plurality of pre-allocated transmission resources is obtained; and when there is an uplink data transmission requirement, at least one transmission resource is selected from the plurality of transmission resources, and uplink data is sent by using the selected transmission resource. An obtaining manner may be obtaining the information about a plurality of pre-allocated transmission resources from a network device.

4. The grant-free transmission may mean: A method for transmitting uplink data by a terminal device can be implemented without dynamic scheduling by a network device, where the dynamic scheduling may be a scheduling manner in which the network device indicates, by using signaling, a transmission resource for each uplink data transmission of the terminal device. Optionally, implementing uplink data transmission of a terminal device can be understood as follows: At least two terminal devices are allowed to perform uplink data transmission on a same time-frequency resource. Optionally, the transmission resource may be a transmission resource of one or more transmission time units following a moment at which the UE receives the signaling. A transmission time unit may be a smallest time unit for one transmission, for example, a transmission time interval (Transmission Time Interval, TTI), where a value may be 1 ms; or a transmission time unit may be a preset transmission time unit.

5. The grant-free transmission may mean: A terminal device performs uplink data transmission without granting from a network device. The granting may mean: The terminal device sends an uplink scheduling request to the network device; and after receiving the scheduling request, the network device sends an uplink grant to the terminal device, where the uplink grant indicates an uplink transmission resource allocated to the terminal device.

6. The grant-free transmission may mean a contention-based transmission mode, and may specifically mean: A plurality of terminals perform uplink data transmission on a same pre-allocated time-frequency resource simultaneously without granting from a network device.

The data may include service data or signaling data.

The blind detection may be understood as detecting possibly arriving data when data arrival is unknown in advance. The blind detection may also be understood as detection without an explicit signaling indication.

The transmission resource may include but is not limited to one or a combination of the following resources: a time-domain resource, such as a radio frame, a subframe, and a symbol; a frequency-domain resource, such as a subcarrier and a resource block; a space-domain resource, such as a transmit antenna and a beam; a code-domain resource, such as a Sparse Code Multiple Access (SCMA) codebook set, a Low Density Signature (LDS) set, and a CDMA code set; and an uplink pilot resource.

The foregoing transmission resource may be used for transmission performed by using a control mechanism including but not limited to the following: uplink power control, such as controlling an upper limit of uplink transmit power; modulation and coding scheme setting, such as setting a transport block size, a code rate, and a modulation order; and a retransmission mechanism, such as a HARQ mechanism.

It should be further understood that, in the embodiment of FIG. 1, an example in which the network device is a base station is used for description, and the network device may alternatively be another access device (such as a radio access point).

For ease of understanding of this application, the terms in the embodiments of this application are described below.

One bottleneck problem of grant-free transmission is a quantity of pilots. If there is a relatively small quantity of pilots, users cannot be distinguished by using the pilots, and the users need to share the pilots. In addition, when a pilot collision occurs, a base station cannot perform accurate user detection or channel estimation, and cannot successfully demodulate data.

In the embodiments of this application, grant-free transmission may mean grant-free multiple access, and may be referred to as autonomous multiple access, contention-based multiple access, or the like.

Therefore, in the embodiments of this application, a Reed-Muller sequence is proposed to implement a pilot sequence. Certainly, a person skilled in the art knows that the Reed-Muller sequence may have another name. The Reed-Muller sequence may be a sequence generated from one or more sets of Reed-Muller codes. According to this manner of generating a Reed-Muller sequence, a large quantity of sequences can be generated, different sequences are closely correlated, and complexity of sequence detection can be considerably reduced by using a fast reconstruction algorithm. It should be understood that, implementing a pilot sequence by using a Reed-Muller sequence in this embodiment of this application can be used for not only grant-free transmission but also another transmission scenario.

The following describes a Reed-Muller sequence generation manner.

1. An order-1 function used for generating a Reed-Muller sequence may be defined as:

$$\phi_b(a) = \frac{1}{\sqrt{2^m}}(-1)^{b^T a}, \qquad \text{formula 1}$$

where $2^m$ is a sequence length, a and b are each a bit vector of a length m, and $b^T a$ indicates a vector inner product. When b is provided, a sequence of a length $2^m$ may be obtained by traversing all possible a's. A column of a matrix H shown in FIG. 2 is referred to as a sequence (which may also be referred to as a codeword). Because b has $2^m$ possible values, there are $2^m$ different sequences. It can be proven that $2^m$ sequences generated by the order-1 Reed-Muller function are orthogonal to each other, and constitute a group of orthogonal bases of vector space of a length m.

2. An order-2 function used for generating a Reed-Muller sequence may be defined as:

$$\phi_{p,b}(a) = \frac{1}{\sqrt{2^m}} i^{(2b+pb)^T a}, \qquad \text{formula 2}$$

where p is a matrix of m rows and m columns, a and b are each a bit vector of a length m, and $i^2 = -1$. Herein, all elements of p, a, and b are 0s or 1s. When p and b are provided, a codeword having $2^m$ elements, that is, a sequence, may be generated. There are a total of $2^{m(m-1)/2}$ different p's and $2^m$ different b's, and a total of $2^{m(m-1)/2}$ sequences may be generated. Therefore, a large quantity of pilot sequences may be provided, to meet a requirement of massive access.

Optionally, the matrix p may be selected from a matrix p set and the vector b may be selected from a vector b set.

Optionally, different pilot sequence lengths may be corresponding to sets having different quantities of elements. In other words, a matrix p set and a vector b set may be determined based on a pilot sequence length, and the matrix p and the vector b may be selected from the matrix p set and the vector b set, respectively.

Optionally, the matrix in the matrix p set is a binary symmetric matrix whose diagonal consists of 0s, and each element of the matrix is 0 or 1. In this case, a function value obtained by using the foregoing formula 2 is a real number.

Optionally, the vector in the vector b set is a binary vector, and each element of the vector is 0 or 1.

It should be understood that, when a Reed-Muller sequence is generated according to the order-2 formula, if p=0, the order-2 formula is equivalent to the foregoing order-1 formula. In other words, various optional solutions used for generating a pilot sequence based on the order-2 formula in this embodiment of this application are also applicable to a case in which a pilot sequence is generated by using the order-1 formula.

It should be understood that, the pilot sequence may alternatively be obtained by using a Reed-Muller function of a higher order.

The foregoing details a Reed-Muller sequence mentioned in the embodiments of this application. The following describes how to perform pilot transmission according to an embodiment of this application with reference to a method 200 shown in FIG. 3. Optionally, the method 200 may be applied to grant-free transmission, and may also be applied to another scenario.

Step 210: A terminal device obtains a to-be-sent pilot sequence, where the to-be-sent pilot sequence is a Reed-Muller sequence.

Optionally, in this embodiment of this application, the to-be-sent pilot sequence may be generated according to a Reed-Muller sequence generation formula. For example, the to-be-sent pilot sequence may be generated according to an order-1 or order-2 Reed-Muller sequence generation formula, or may be generated according to a higher-order Reed-Muller sequence generation formula.

Optionally, in this embodiment of this application, the terminal device may obtain the to-be-sent pilot sequence from a pilot sequence set, where the pilot sequence set may include at least two Reed-Muller sequences. A pilot in the pilot sequence set may be generated according to a Reed-Muller sequence formula and is stored in the terminal device. The pilot may be stored in a form of a table.

The to-be-sent pilot sequence may be selected from the pilot sequence set randomly or based on a pilot index. Certainly, the pilot index may be called by another name such as a pilot number by a person skilled in the art. The pilot index may be used as a basis for selecting a pilot sequence from a pilot sequence set and may be in various forms. For example, the pilot index may be generated by using a random number generator. For example, different initial values may be set for a pseudo-noise (PN) sequence to generate different random number sequences, so that the pilot index is obtained accordingly. A possible method for selecting the initial value is based on at least one of an identifier of the terminal, a system frame number, a timeslot number, and a cell identifier. The system frame number may be a sequence number of a frame in which a target pilot sequence is to be transmitted, the timeslot number may be a number of a timeslot in which the target pilot sequence is to be transmitted, and the cell identifier may be an identifier of a cell in which the terminal device is located.

Optionally, pilot sequence sets corresponding to various pilot sequence lengths may be pre-stored in the terminal device. After a length of the to-be-sent pilot sequence is determined, the to-be-sent pilot sequence may be selected from a pilot sequence set corresponding to the length.

Figure 3:
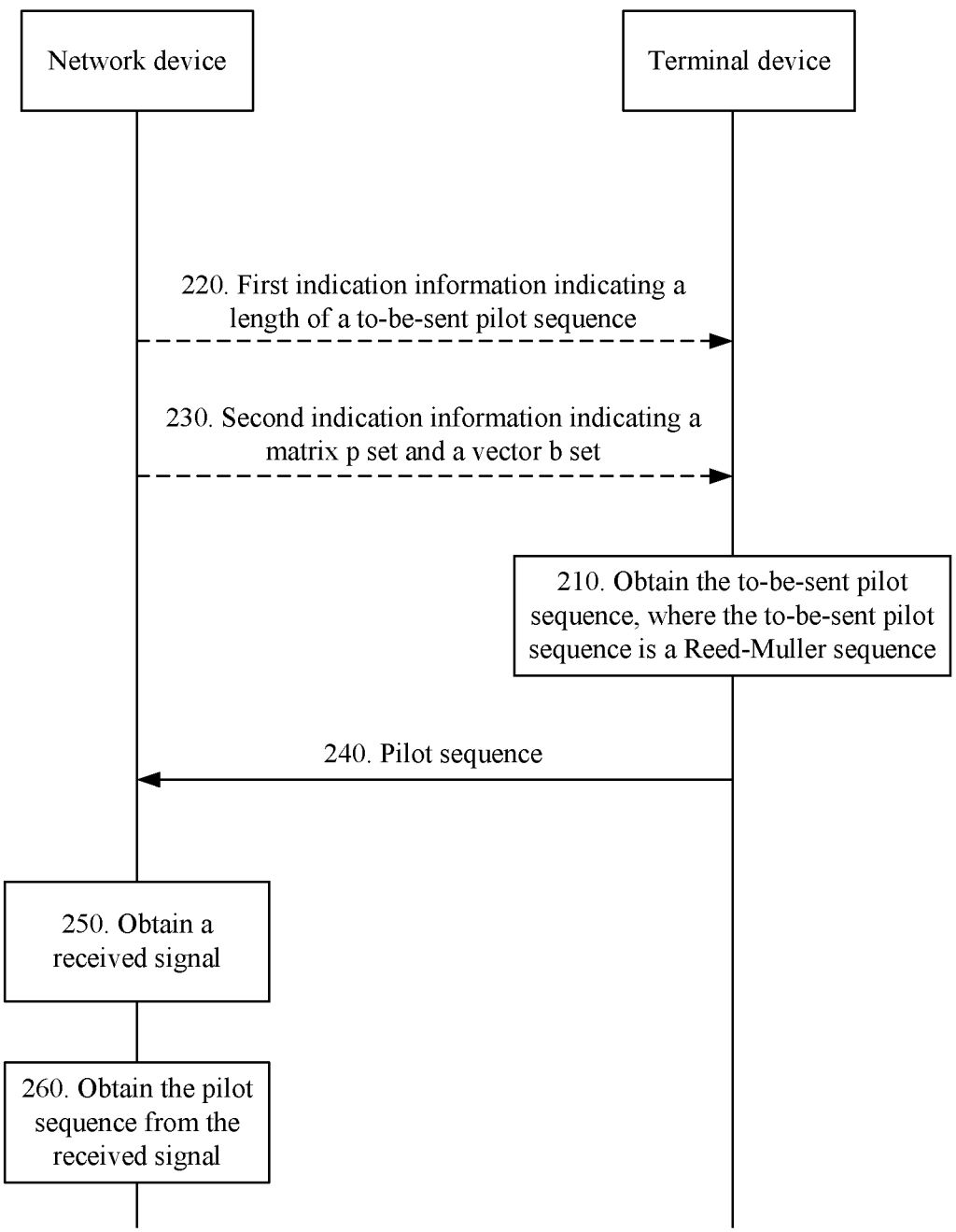
FIG. 3 is a schematic flowchart of an information transmission method according to an embodiment of this application.

Optionally, as shown in FIG. 3, the method 200 may further include step 220: A network device sends first indication information, and optionally sends the first indication information to the terminal device, and the terminal device performs a corresponding receiving action, where the first indication information is used to indicate a length of the to-be-sent pilot sequence. In this way, the terminal device may determine the length of the to-be-sent pilot sequence based on indication of the first indication information.

A longer length of a pilot sequence indicates a larger quantity of pilots that can be selected and a larger quantity of terminals that can be distinguished. However, corresponding resource overheads and detection complexity are also increased. Therefore, a pilot sequence length may be adjusted depending on different application scenarios. For example, the pilot sequence length may be adjusted based on a time segment. For example, there is a smaller quantity of users at night, and a shorter sequence length may be used.

Optionally, in this embodiment of this application, the length $2^m$ of the to-be-sent pilot sequence may be determined first, and then the matrix p of m rows and m columns and the vector b of m rows are selected. An order-2 Reed-Muller sequence is obtained as the to-be-sent pilot sequence according to the formula 2 by using the matrix p and the vector b.

Optionally, after the length of the pilot sequence is determined, the matrix p may be selected from a matrix p set corresponding to the length, where the matrix p set includes a plurality of matrices p of m rows and m columns; and the vector b of m rows may be selected from a vector b set corresponding to the length, where the vector b set includes a plurality of vectors b of m rows.

Optionally, the matrix p may be selected from the matrix p set and the vector b may be selected from the vector b set based on a pilot index. The pilot index may be generated by using a random number generator. For example, different initial values may be set for a PN sequence to generate different random number sequences, so that the pilot index is obtained accordingly. A possible method for selecting the initial value is based on at least one of an identifier of the terminal, a system frame number, a timeslot number, and a cell identifier. The system frame number may be a sequence number of a frame in which a target pilot sequence is to be transmitted, the timeslot number may be a number of a timeslot in which the target pilot sequence is to be transmitted, and the cell identifier may be an identifier of a cell in which the terminal device is located.

Optionally, a same pilot index may be used to select the matrix p from the matrix p set and the vector b from the vector b set. Certainly, different pilot indexes may be used to select the matrix p from the matrix p set and the vector b from the vector b set.

Optionally, as shown in FIG. 3, the method 200 may further include step 230: The network device sends second indication information, and optionally sends the second indication information to the terminal device, and the terminal device performs a corresponding receiving action, where the second indication information is used to indicate a matrix p set and/or a vector b set. For example, the terminal device may pre-store a plurality of matrix p sets and a plurality of vector b sets. The network device may notify the terminal device of an index of a matrix p set needed to be used and an index of a vector b set needed to be used. The terminal device selects the matrix p set from the plurality of matrix p sets based on the index of the matrix p set notified by the network device, and selects the vector b set from the plurality of vector b sets based on the index of the vector b set notified by the network device, so as to select the matrix p from the selected matrix p set and select the vector b from the selected vector b set.

Optionally, information for indicating the matrix p set and information for indicating the vector b set may be carried in different indication information. The different indication information may be carried in different fields of a same message, or may be carried in different messages.

Optionally, after determining the matrix p and the vector b, the terminal device may generate the pilot sequence according to the foregoing formula 2. Alternatively, pilot sequences corresponding to all matrices p and all vectors b may be pre-stored in the terminal device, and the terminal device may find the corresponding pilot sequence based on the matrix p and the vector b. The pre-stored pilot sequences may also be generated according to the foregoing formula 2.

It should be understood that, both step 220 and step 230 shown in FIG. 3 are optional operations of the method 200. The method 200 may include step 220 but does not include step 230, or may include step 230 but does not include step 220, or may include step 220 and step 230. For example, when step 220 is included but step 230 is not included, the terminal device may search, based on the length of the to-be-sent pilot sequence indicated by the first indication information, information stored in the terminal device for the matrix p set and the vector b set that are corresponding to the length of the pilot sequence. For example, when step 230 is included but step 220 is not included, the terminal device may determine the length of the to-be-sent pilot sequence based on a size of a to-be-sent time-frequency resource, and select the matrix p from the matrix p set indicated by the second indication information and select the vector b from the vector b set indicated by the second indication information.

Optionally, the foregoing first indication information and second indication information may be sent by using a same broadcast message, or may be sent by using different broadcast messages.

Optionally, the to-be-sent pilot sequence is a pilot sequence for user status detection, for example, an activity detection reference signal (ADRS). In this case, the terminal device sends the to-be-sent pilot sequence on partial bandwidth of available bandwidth.

Figure 4:
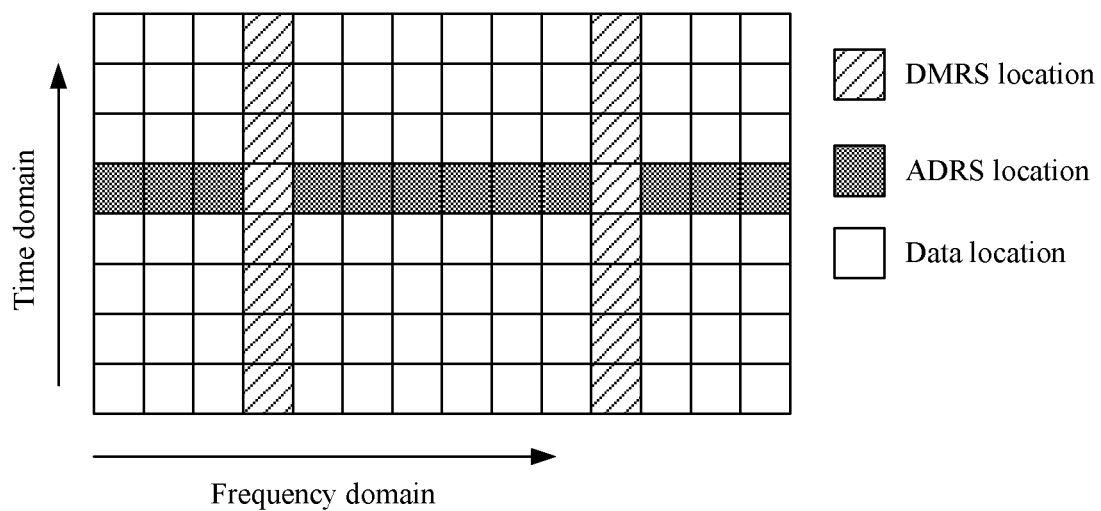
FIG. 4 is a diagram of time-frequency resource utilization according to an embodiment of this application.

In this embodiment of this application, a pilot used for grant-free transmission may include an ADRS and a demodulation reference signal (DMRS). The ADRS is used for user status detection, may be implemented by using a Reed-Muller sequence, and is sent only on some sub-bands. The DMRS is used for channel estimation for data demodulation. Increasing a quantity of pilots by using sequence grouping can allow partial collision between different pilots. Transmission of the ADRS and the DMRS is shown in FIG. 4, but is not limited thereto.

Optionally, the ADRS may be in one-to-one correspondence with the DMRS.

In this embodiment of this application, separating the pilots of two functions can reduce overall pilot resource overheads and channel estimation complexity.

Step 240. The terminal device sends the to-be-sent pilot sequence, and optionally sends the to-be-sent pilot sequence to the network device.

Optionally, in this embodiment of this application, when a size of a time-frequency resource occupied by the pilot sequence is smaller than that of a to-be-used time-frequency resource, length compensation processing may be performed on the pilot sequence, to be specific, some bits of the pilot sequence may be repeatedly carried on redundant time-frequency resources.

Step 250. The network device obtains a received signal, where the received signal includes a pilot sequence sent by at least one terminal device, the pilot sequence is a Reed-Muller sequence, and the at least one terminal device includes the foregoing terminal device.

Step 260. The network device obtains the pilot sequence sent by the at least one terminal device from the received signal.

It should be understood that, although for ease of illustration, FIG. 3 shows only one terminal device, this application is not limited thereto. In other words, there may be a plurality of terminal devices that send a pilot sequence to the network device on a same time-frequency resource. After obtaining a received signal that includes pilot sequences of the plurality of terminal devices, the network device may separately obtain a pilot sequence sent by each terminal device from the received signal.

Specifically, it is assumed that the pilot sequence received by the network device is obtained by superposing pilot sequences sent by a plurality of active terminal devices:

$$y = \sum_{i=1}^{s} h_i \phi_{p_i, b_i} + n_{p_i, b_i},$$

where $h_i$ is a channel gain of a user i, S indicates a quantity of active users, and n indicates a noise signal.

After receiving the superimposed pilot sequence, the network device may detect the pilot sequence to obtain the pilot sequence sent by each terminal device.

Figure 5:
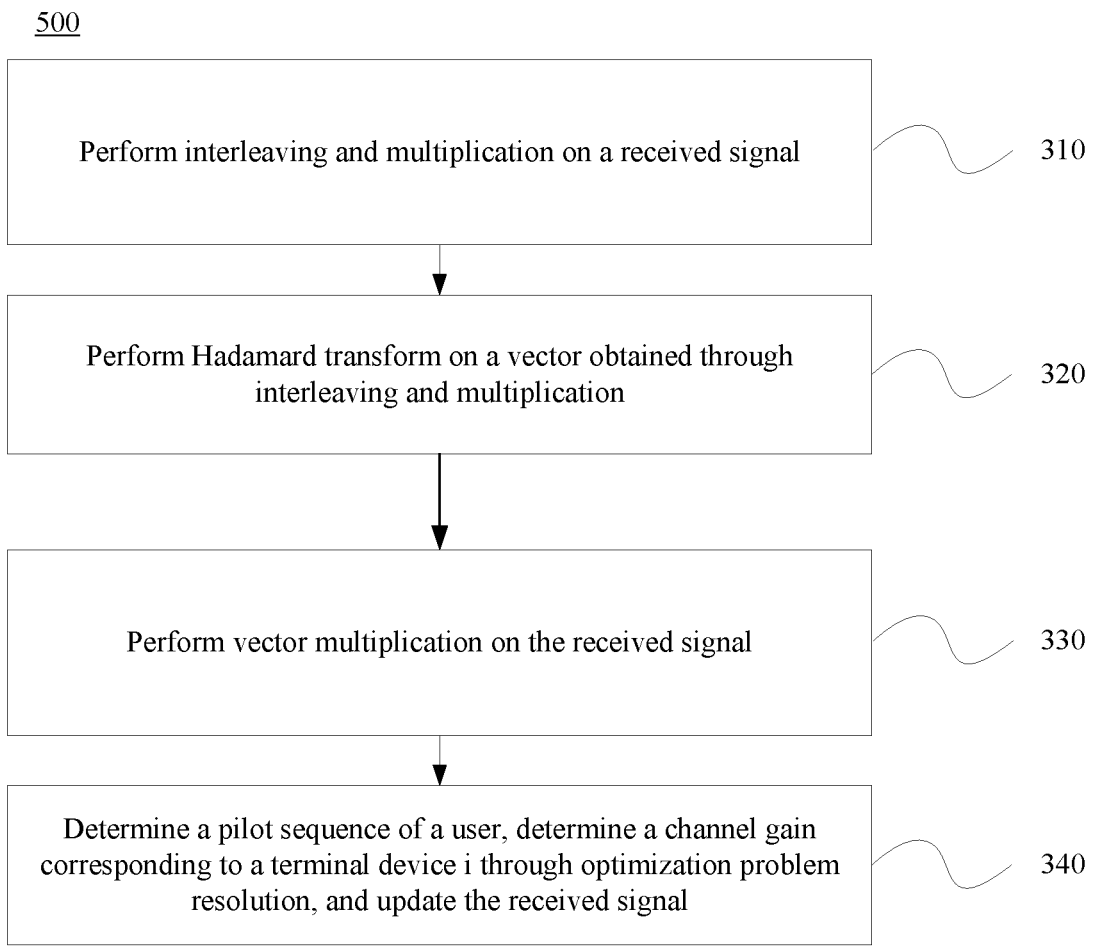
FIG. 5 is a schematic flowchart of an information transmission method according to an embodiment of this application.

The following describes an optional detection method 300 with reference to FIG. 5.

A pilot sequence is detected by using S steps. In each step, a status of one active user is estimated and channel estimation is performed. It is assumed that $y_1 = y$, and a $k^{th}$ step is as follows.

Step 310. Perform interleaving and multiplication on a received signal Y:

$$y_k(a \oplus e)\overline{y_k(a)} = \frac{1}{2^m} \sum_{i=1}^{S} |h_i|^2 (-1)^{b_i^T e} (-1)^{(p_i e)^{T_a}} + chirps,$$

where chirps are cross items between a noise and different $p_i$'s, a is a bit vector of a length m and has a total of $2^m$ values, e is a unit vector of the length m, a quantity of possible values of e is m, $y_k(a)$ represents an element at a corresponding location of a vector $y_k$, $y_k(a \oplus e)$ is equivalent to interleaving $y_k(a)$, $y_k(a \oplus e)\overline{y_k(a)}$ means that the interleaved vector is multiplied by $\overline{y_k(a)}$, and $\overline{y_k(a)}$ means conjugation of $y_k(a)$. A value obtained after interleaving and multiplication is equivalent to a value on the right side of the equation.

For example, when m=2, a has $2^m$=4 possible values expressed in binary notation as 00, 01, 10, and 11, and e has 2 possible values expressed in binary notation as 10 and 01. In the foregoing equation, $y_k(a)$ represents the element at the corresponding location of the vector $y_k$. For example, $y_k(00)$ represents a first element, $y_k(01)$ represents a second element, and so on. In the foregoing equation, a⊕e means that bitwise modulo-2 addition is performed on a and e. When e=10 and a is 00, 01, 10, or 11, a⊕e is 10, 11, 00, or 01. Therefore, y(a⊕e) is equivalent to interleaving y(a). When e=10, $y_k(a \oplus e)\overline{y_k(a)}$ means that an element in a vector ($y_k(10)$, $y_k(11)$, $y_k(00)$, and $y_k(01)$) is multiplied by an element at a corresponding location in a vector ($\overline{y_k(00)}$, $\overline{y_k(01)}$, $\overline{y_k(10)}$, and $\overline{y_k(11)}$), that is, ($y_k(10)\overline{y_k(00)}$, $y_k(11)\overline{y_k(01)}$, $y_k(00)\overline{y_k(10)}$, and $y_k(01)\overline{y_k(11)}$).

Step 320. Perform Hadamard transform on a vector obtained through interleaving and multiplication to obtain $p_i$.

Specifically, a length of the vector is $2^m$, and therefore a length of a vector obtained after transform is also $2^m$. From $2^m$ values, an element having maximum amplitude is found, and a number of the element is a column of $p_i$. When m=2 and e=10, a vector of a length 4 is obtained after Hadamard transform is performed. If a first element has maximum amplitude, a first column of $p_i$ is 00; if a second element has maximum amplitude, a first column of $p_i$ is 01, and so on. When e=01, a value of a second column of $p_i$ may be obtained by using a same method.

$p_i$ may be restored by repeating this process. Complexity of the operation is $O(m2^{2m})$, that is, the complexity is in direct proportion to $m2^{2m}$.

Step 330. Perform vector multiplication on a signal $y_k(a)$:

$$y_k(a)\overline{\phi_{P_1,0}}(a) = \frac{1}{2^m} h_i (-1)^{w(b_i)^{T_a}} + chirps.$$

A peak value is generated at $b_i$ when Hadamard transform is performed on the right side of the foregoing equation. Accordingly, $p_i^{b_i}$ may be restored. Complexity of the operation is $O(2^{2m})$, that is, the complexity is in direct proportion to $2^{2m}$.

Step 340. Determine a pilot sequence of a user, determine a channel gain corresponding to a terminal device i through optimization problem resolution, and update the received signal.

The pilot sequence of the user is obtained based on $p_i$ and $b_i$ by using the foregoing formula 2.

The channel gain corresponding to the terminal device i is determined through optimization problem resolution:

$$\min\{(y_k - h_i \phi_{p_i, b_i})^2\}.$$

The received signal is updated:

$$y_{k+1} = y_k - h_i \phi_{p_i, b_i}.$$

A base station completes user status detection and channel estimation by using the foregoing algorithm, thereby implementing an important step of grant-free access.

Optionally, in this embodiment of this application, the terminal device further sends data to a network device.

The network device may send a feedback message to the terminal device based on a decoding status of the data. The feedback message is used to indicate whether the pilot sequence is detected and whether the data is successfully decoded.

There may be a plurality of results for sending the data by the terminal device after the terminal device accesses the network device in a grant-free mode. A first result is that the network device detects the pilot sequence and successfully decodes the data. A second result is that the network device detects the pilot sequence but unsuccessfully decodes the data. A third result is that the network device detects no pilot sequence. In the first case, the network device may send an acknowledgment (ACK) feedback message to the terminal device. In the second case, the network device may send a negative acknowledgment (NACK) feedback message to the terminal device. When receiving the NACK sent by the network device, the terminal device may retransmit the data to the network device.

It should be understood that, in this embodiment of this application, the sequence generated according to the formula 1, the formula 2, or a formula of a higher order is referred to as a Reed-Muller sequence, or may be called by another name. Any sequence that is generated according to the formula 1, the formula 2, or a corresponding variant formula is within the protection scope of this application.

Figure 6:
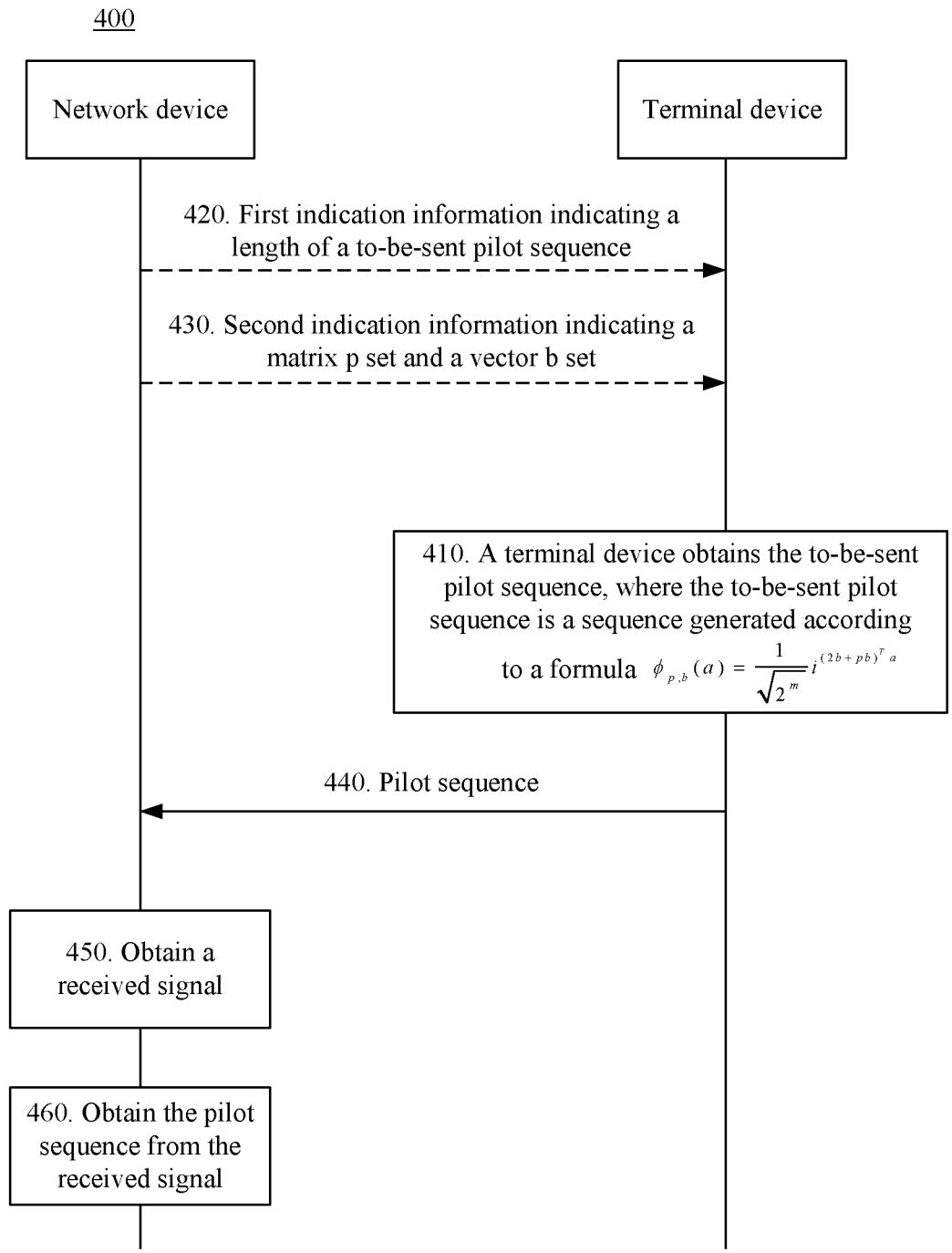
FIG. 6 is a schematic flowchart of an information transmission method according to an embodiment of this application.

FIG. 6 is a schematic flowchart of an information transmission method 400 according to an embodiment of this application. Optionally, the method 400 may be used for grant-free transmission.

As shown in FIG. 6, the method includes the following steps.

Step 410. A terminal device obtains a to-be-sent pilot sequence, where the to-be-sent pilot sequence is a sequence generated according to a formula $$\phi_{p,b}(a) = \frac{1}{\sqrt{2^m}} i^{(2b+pb)^T a},$$

where a length of the pilot sequence is $2^m$ and m is a positive integer; p is a matrix of m rows and m columns; b is a vector of m rows; a is a bit vector with a length of m and consisting of 0s and 1s, has a total of $2^m$ possible values, and is corresponding to $2^m$ elements of the pilot sequence; and $i^2 = -1$.

Optionally, the terminal device obtains the to-be-sent pilot sequence from a pilot sequence set, where the pilot sequence set includes at least two sequences. A pilot sequence in the pilot sequence set may be a sequence generated according to the formula $$\phi_{p,b}(a) = \frac{1}{\sqrt{2^m}} i^{(2b+pb)^T a}$$

and is stored in the terminal device.

The to-be-sent pilot sequence may be selected from the pilot sequence set randomly or based on a pilot index. For example, the pilot index may be generated by using a random number generator. For example, different initial values may be set for a pseudo-noise (Pseudo-noise, PN) sequence to generate different random number sequences, so that the pilot index is obtained accordingly. A possible method for selecting the initial value is based on at least one of an identifier of the terminal, a system frame number, a timeslot number, and a cell identifier. The system frame number may be a sequence number of a frame in which a target pilot sequence is to be transmitted, the timeslot number may be a number of a timeslot in which the target pilot sequence is to be transmitted, and the cell identifier may be an identifier of a cell in which the terminal device is located.

Optionally, pilot sequence sets corresponding to various pilot sequence lengths may be pre-stored in the terminal device. After the length of the to-be-sent pilot sequence is determined, the to-be-sent pilot sequence may be selected from a pilot sequence set corresponding to the length.

Optionally, as shown in FIG. 6, the method 400 may further include step 420: A network device sends first indication information, and optionally sends the first indication information to the terminal device, and the terminal device performs a corresponding receiving action, where the first indication information is used to indicate the length of the to-be-sent pilot sequence. In this way, the terminal device may determine the length of the to-be-sent pilot sequence based on indication of the first indication information.

Optionally, the terminal device determines the length of the to-be-sent pilot sequence, where the length of the to-be-sent pilot sequence is $2^m$ and m is a positive integer; determines the matrix p of m rows and m columns and the vector b of m rows; and generates a sequence as the to-be-sent pilot sequence according to the formula $$\phi_{p,b}(a) = \frac{1}{\sqrt{2^m}} i^{(2b+pb)^T a}.$$

Optionally, the terminal device selects the matrix p from a matrix p set corresponding to m; and selects the vector b from a vector b set corresponding to m.

The matrix p may be selected from the matrix p set and the vector b may be selected from the vector b set based on a pilot index. The pilot index may be generated by using a random number generator. For example, different initial values may be set for a PN sequence to generate different random number sequences, so that the pilot index is obtained accordingly. A possible method for selecting the initial value is based on at least one of an identifier of the terminal, a system frame number, a timeslot number, and a cell identifier. The system frame number may be a sequence number of a frame in which a target pilot sequence is to be transmitted, the timeslot number may be a number of a timeslot in which the target pilot sequence is to be transmitted, and the cell identifier may be an identifier of a cell in which the terminal device is located.

Optionally, a same pilot index may be used to select the matrix p from the matrix p set and the vector b from the vector b set. Certainly, different pilot indexes may be used to select the matrix p from the matrix p set and the vector b from the vector b set.

Optionally, as shown in FIG. 6, the method 400 may further include step 430: The network device sends second indication information, and optionally sends the second indication information to the terminal device, and the terminal device performs a corresponding receiving action, where the second indication information is used to indicate a matrix p set and/or a vector b set. For example, the terminal device may pre-store a plurality of matrix p sets and a plurality of vector b sets. The network device may notify the terminal device of an index of a matrix p set needed to be used and an index of a vector b set needed to be used. The terminal device selects the matrix p set from the plurality of matrix p sets based on the index of the matrix p set notified by the network device, and selects the vector b set from the plurality of vector b sets based on the index of the vector b set notified by the network device, so as to select the matrix p from the selected matrix p set and select the vector b from the selected vector b set.

Optionally, information for indicating the matrix p set and information for indicating the vector b set may be carried in different indication information. The different indication information may be carried in different fields of a same message, or may be carried in different messages.

Optionally, after determining the matrix p and the vector b, the terminal device may generate the pilot sequence according to the formula $$\phi_{p,b}(a) = \frac{1}{\sqrt{2^m}} i^{(2b+pb)^T a}.$$

Alternatively, pilot sequences corresponding to all matrices p and all vectors b may be pre-stored in the terminal device, and the terminal device may find the corresponding pilot sequence based on the matrix p and the vector b. The pre-stored pilot sequences may also be generated according to the foregoing formula $$\phi_{p,b}(a) = \frac{1}{\sqrt{2^m}} i^{(2b+pb)^T a}.$$

It should be understood that, both step 420 and step 430 shown in FIG. 6 are optional operations of the method 400. The method 400 may include step 420 but does not include step 430, or may include step 430 but does not include step 420, or may include step 420 and step 430. For example, when step 420 is included but step 430 is not included, the terminal device may search, based on the length of the to-be-sent pilot sequence indicated by the first indication information, information stored in the terminal device for the matrix p set and the vector b set that are corresponding to the length of the pilot sequence. For example, when step 430 is included but step 420 is not included, the terminal device may determine the length of the to-be-sent pilot sequence based on a size of a to-be-sent time-frequency resource, and select the matrix p from the matrix p set indicated by the second indication information and select the vector b from the vector b set indicated by the second indication information.

Optionally, the foregoing first indication information and second indication information may be sent by using a same broadcast message, or may be sent by using different broadcast messages.

Optionally, the matrix in the matrix p set is a binary symmetric matrix whose diagonal consists of 0s, and each element of the matrix is 0 or 1; and/or the vector in the vector b set is a binary vector, and each element of the vector is 0 or 1.

Optionally, the to-be-sent pilot sequence is used for user status detection.

Optionally, the terminal device sends the to-be-sent pilot sequence on partial bandwidth of available bandwidth.

Step 440. The terminal device sends the to-be-sent pilot sequence.

Step 450. The network device obtains a received signal, where the received signal includes a pilot sequence sent by at least one terminal device, and the pilot sequence is a sequence generated according to a formula $$\phi_{p,b}(a) = \frac{1}{\sqrt{2^m}} i^{(2b+pb)^T a},$$

where a length of the pilot sequence is $2^m$ and m is a positive integer; p is a matrix of m rows and m columns; b is a vector of m rows; a is a bit vector with a length of m and consisting of 0s and 1s, has a total of $2^m$ possible values, and is corresponding to $2^m$ elements of the pilot sequence; and $i^2=-1$. The at least one terminal device includes the foregoing terminal device.

Step 460. The network device obtains the pilot sequence sent by the at least one terminal device from the received signal.

It should be understood that, although for ease of illustration, FIG. 6 shows only one terminal device, this application is not limited thereto. In other words, there may be a plurality of terminal devices that send a pilot sequence to the network device on a same time-frequency resource. After obtaining a received signal that includes pilot sequences of the plurality of terminal devices, the network device may separately obtain a pilot sequence sent by each terminal device from the received signal.

Optionally, in this embodiment of this application, the terminal device further sends data to the network device.

There may be a plurality of results for sending the data by the terminal device after the terminal device accesses the network device in a grant-free mode. A first result is that the network device detects the pilot sequence and successfully decodes the data. A second result is that the network device detects the pilot sequence but unsuccessfully decodes the data. A third result is that the network device detects no pilot sequence. In the first case, the network device may send an acknowledgment (ACK) feedback message to the terminal device. In the second case, the network device may send a negative acknowledgment (NACK) feedback message to the terminal device. When receiving the NACK sent by the network device, the terminal device may retransmit the data to the network device.

Figure 7:
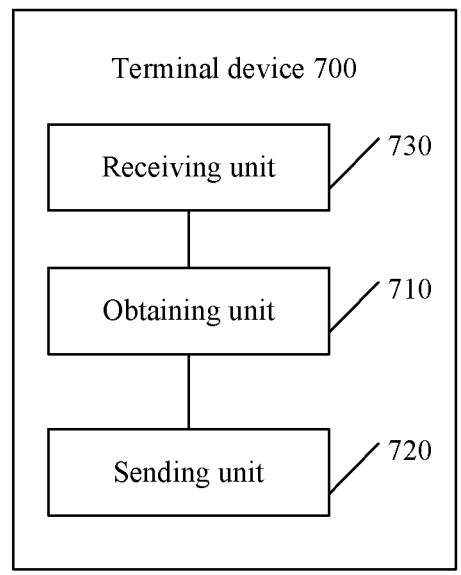
FIG. 7 is a schematic block diagram of a terminal device according to an embodiment of this application.

FIG. 7 is a schematic block diagram of a terminal device 700 according to an embodiment of this application. As shown in FIG. 7, the terminal device 700 includes: an obtaining unit 710, configured to obtain a to-be-sent pilot sequence, where the to-be-sent pilot sequence is a Reed-Muller sequence; and a sending unit 720, configured to send the to-be-sent pilot sequence.

Optionally, the terminal device is applied to grant-free transmission.

Optionally, the to-be-sent pilot sequence is generated according to a Reed-Muller sequence generation formula.

Optionally, the to-be-sent pilot sequence is an order-2 Reed-Muller sequence generated according to a formula $$\phi_{p,b}(a) = \frac{1}{\sqrt{2^m}} i^{(2b+pb)^T a},$$

where a length of the pilot sequence is $2^m$ and m is a positive integer; p is a matrix of m rows and m columns; b is a vector of m rows; a is a bit vector with a length of m and consisting of 0s and 1s, has a total of $2^m$ possible values, and is corresponding to $2^m$ elements of the pilot sequence; and $i^2=-1$.

Optionally, the obtaining unit 710 is specifically configured to: obtain the to-be-sent pilot sequence from a pilot sequence set, where the pilot sequence set includes at least two Reed-Muller sequences.

Optionally, the obtaining unit 710 is specifically configured to: determine the length of the to-be-sent pilot sequence, where the length of the to-be-sent pilot sequence is $2^m$ and m is a positive integer; determine the matrix p of m rows and m columns and the vector b of m rows; and generate an order-2 Reed-Muller sequence as the to-be-sent pilot sequence according to the formula $$\phi_{p,b}(a) = \frac{1}{\sqrt{2^m}} i^{(2b+pb)^T a}.$$

Optionally, as shown in FIG. 7, the terminal device 700 further includes a receiving unit 730, configured to receive first indication information sent by a network device, where the first indication information is used to indicate the length of the to-be-sent pilot sequence. The obtaining unit 710 is specifically configured to determine the length of the to-be-sent pilot sequence based on indication of the first indication information.

Optionally, the obtaining unit 710 is specifically configured to determine the length of the to-be-sent pilot sequence based on a size of a to-be-used time-frequency resource.

Optionally, the matrix p is a binary symmetric matrix.

Optionally, the obtaining unit 710 is specifically configured to: select the matrix p from a matrix p set corresponding to m; and select the vector b from a vector b set corresponding to m.

Optionally, the matrix p in the matrix p set is a binary symmetric matrix whose diagonal consists of 0s, and each element of the matrix p is 0 or 1; and/or the vector b in the vector b set is a binary vector, and each element of the vector b is 0 or 1.

Optionally, the obtaining unit 710 is specifically configured to: generate a pilot index based on at least one of an identifier of the terminal device, a system frame number, a timeslot number, and a cell identifier; select, based on the pilot index, the matrix p from the matrix p set corresponding to m; and select, based on the pilot index, the vector b from the vector b set corresponding to m.

Optionally, as shown in FIG. 7, the terminal device further includes the receiving unit 730, configured to receive second indication information sent by the network device, where the second indication information is used to indicate the matrix p set and/or the vector b set.

Optionally, the to-be-sent pilot sequence is used for user status detection.

Optionally, the sending unit 720 is specifically configured to send the to-be-sent pilot sequence on partial bandwidth of available bandwidth.

Optionally, the sending unit 720 is further configured to send data to the network device.

Optionally, as shown in FIG. 7, the terminal device 700 further includes the receiving unit 730, configured to receive a feedback message sent by the network device, where the feedback message is used to indicate whether the data and the pilot sequence are successfully decoded. Specifically, the receiving unit receives an acknowledgment feedback message sent by the network device, where the acknowledgment feedback message is used to indicate that the pilot sequence is detected and the data is successfully decoded; or receives a negative acknowledgment feedback message sent by the network device, where the negative acknowledgment feedback message is used to indicate that the pilot sequence is detected but the data is unsuccessfully decoded.

It should be understood that, the terminal device 700 may be corresponding to the terminal device in the method 200, and may have the corresponding functions of the terminal device in the method 200. For brevity, details are not repeated herein.

Figure 8:
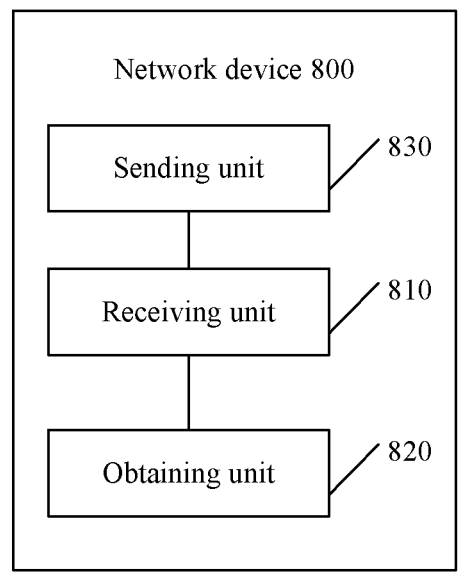
FIG. 8 is a schematic block diagram of a network device according to an embodiment of this application.

FIG. 8 is a schematic block diagram of a network device 800 according to an embodiment of this application. As shown in FIG. 8, the network device 800 includes: a receiving unit 810, configured to obtain a received signal, where the received signal includes a pilot sequence of at least one terminal device, and the pilot sequence is a Reed-Muller sequence; and an obtaining unit 820, configured to obtain the pilot sequence of the at least one terminal device from the received signal.

Optionally, the pilot sequence is an order-2 Reed-Muller sequence generated according to a formula $$\phi_{p,b}(a) = \frac{1}{\sqrt{2^m}} i^{(2b+pb)^T a},$$

where a length of the pilot sequence is $2^m$ and m is a positive integer; p is a matrix of m rows and m columns; b is a vector of m rows; a is a bit vector with a length of m and consisting of 0s and 1s, has a total of $2^m$ possible values, and is corresponding to $2^m$ elements of the pilot sequence; and $i^2=-1$.

Optionally, as shown in FIG. 8, the network device 800 further includes a sending unit 830, configured to send first indication information to the terminal device, where the first indication information is used to indicate a length of a to-be-sent pilot sequence.

Optionally, as shown in FIG. 8, the network device 800 further includes the sending unit 830, configured to send second indication information to the terminal device, where the second indication information is used to indicate a vector b set and/or a matrix p set, the vector b set is used by the terminal device to select the vector b, and the matrix p set is used by the terminal device to select the matrix p.

Optionally, as shown in FIG. 8, the network device 800 further includes the sending unit 830. The receiving unit 810 is further configured to detect, based on a pilot sequence of each terminal device, data sent by the terminal device. The sending unit 830 is further configured to: send an acknowledgment feedback message to the terminal device when the data is successfully decoded; or send a negative acknowledgment feedback message to the terminal device when the data is unsuccessfully decoded.

It should be understood that, the network device 800 may be corresponding to the network device in the method 200, and may have the corresponding functions of the network device in the method 200. For brevity, details are not repeated herein.

Figure 9:
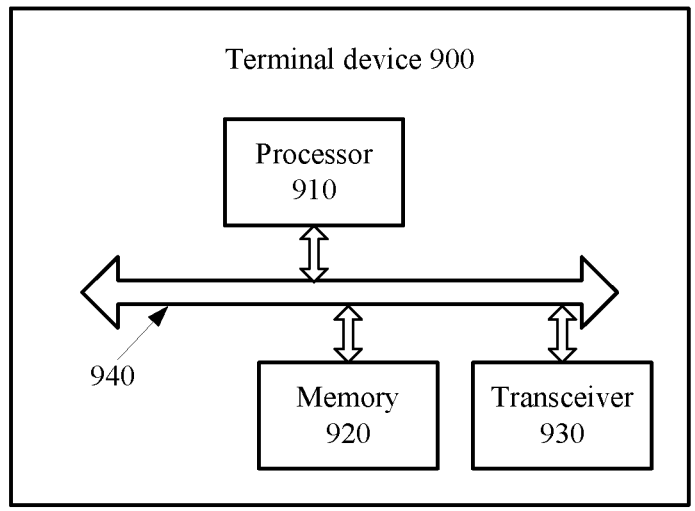
FIG. 9 is a schematic block diagram of a terminal device according to an embodiment of this application.

FIG. 9 is a schematic block diagram of a terminal device 900 according to an embodiment of this application. As shown in FIG. 9, the terminal device 900 includes a processor 910, a memory 920, a transceiver 930, and a bus system 940. The memory 920 is configured to store a program instruction. The processor 910 may invoke the program instruction stored in the memory 920. The processor 910, the memory 920, and the transceiver 930 are connected by using the bus system 940.

The processor 910 is configured to invoke the program instruction stored in the memory 920, to perform the following operations: obtaining a to-be-sent pilot sequence, where the to-be-sent pilot sequence is a Reed-Muller sequence; and controlling the transceiver 930 to send the to-be-sent pilot sequence.

Optionally, the terminal device 900 is applied to grant-free transmission.

Optionally, the to-be-sent pilot sequence is generated according to a Reed-Muller sequence generation formula.

Optionally, the to-be-sent pilot sequence is an order-2 Reed-Muller sequence generated according to a formula $$\phi_{p,b}(a) = \frac{1}{\sqrt{2^m}} i^{(2b+pb)^T a},$$

where $2^m$ is a length of the pilot sequence; p is a matrix of m rows and m columns; b is a vector of m rows; a is a bit vector with a length of m and consisting of 0s and 1s, has a total of $2^m$ possible values, and is corresponding to $2^m$ elements of the pilot sequence; and $i^2 = -1$.

Optionally, the processor 910 is configured to invoke the program instruction stored in the memory 920, to perform the following operation: obtaining the to-be-sent pilot sequence from a pilot sequence set, where the pilot sequence set includes at least two Reed-Muller sequences.

Optionally, the processor 910 is configured to invoke the program instruction stored in the memory 920, to perform the following operations: determining the length of the to-be-sent pilot sequence, where the length of the to-be-sent pilot sequence is $2^m$ and m is a positive integer; determining the matrix p of m rows and m columns and the vector b of m rows; and generating an order-2 Reed-Muller sequence as the to-be-sent pilot sequence according to the formula $$\phi_{p,b}(a) = \frac{1}{\sqrt{2^m}} i^{(2b+pb)^T a}.$$

Optionally, the processor 910 is configured to invoke the program instruction stored in the memory 920, to perform the following operations: controlling the transceiver 930 to receive first indication information sent by a network device, where the first indication information is used to indicate the length of the to-be-sent pilot sequence; and determining the length of the to-be-sent pilot sequence based on indication of the first indication information.

Optionally, the processor 910 is configured to invoke the program instruction stored in the memory 920, to perform the following operation: determining the length of the to-be-sent pilot sequence based on a size of a to-be-used time-frequency resource.

Optionally, the matrix p is a binary symmetric matrix.

Optionally, the processor 910 is configured to invoke the program instruction stored in the memory 920, to perform the following operations: selecting the matrix p from a matrix p set corresponding to m; and selecting the vector b from a vector b set corresponding to m.

Optionally, the matrix p in the matrix p set is a binary symmetric matrix whose diagonal consists of 0s, and each element of the matrix p is 0 or 1; and/or the vector b in the vector b set is a binary vector, and each element of the vector b is 0 or 1.

Optionally, the processor 910 is configured to invoke the program instruction stored in the memory 920, to perform the following operations: generating a pilot index based on at least one of an identifier of the terminal device, a system frame number, a timeslot number, and a cell identifier; selecting, based on the pilot index, the matrix p from the matrix p set corresponding to m; and selecting, based on the pilot index, the vector b from the vector b set corresponding to m.

Optionally, the processor 910 is configured to invoke the program instruction stored in the memory 920, to perform the following operation: controlling the transceiver 930 to receive second indication information sent by the network device, where the second indication information is used to indicate the matrix p set and/or the vector b set.

Optionally, the to-be-sent pilot sequence is used for user status detection.

Optionally, the processor 910 is configured to invoke the program instruction stored in the memory 920, to perform the following operation: sending the to-be-sent pilot sequence on partial bandwidth of available bandwidth.

Optionally, the processor 910 is configured to invoke the program instruction stored in the memory 920, to perform the following operation: controlling the transceiver 930 to send data to the network device.

Optionally, the processor 910 is configured to invoke the program instruction stored in the memory 920, to perform the following operation: controlling the transceiver 930 to receive a feedback message sent by the network device, where the feedback message is used to indicate whether the data and the pilot sequence are successfully decoded.

It should be understood that, the terminal device 900 may be corresponding to the terminal device in the method 200, and may have the corresponding functions of the terminal device in the method 200. For brevity, details are not repeated herein.

Figure 10:
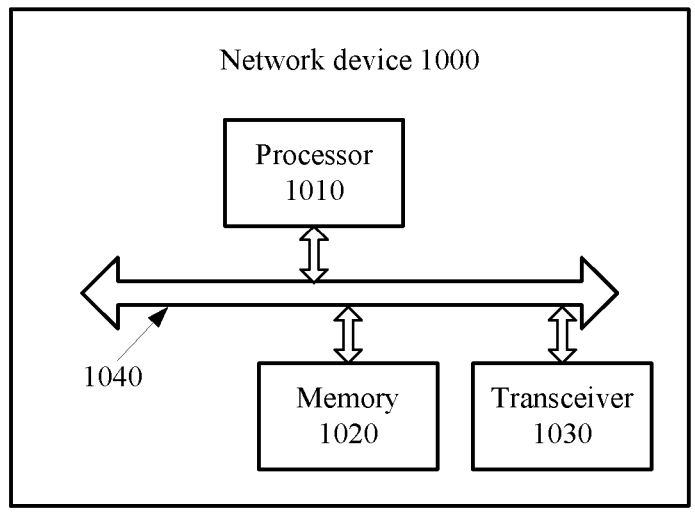
FIG. 10 is a schematic block diagram of a network device according to an embodiment of this application.
Figure 12:
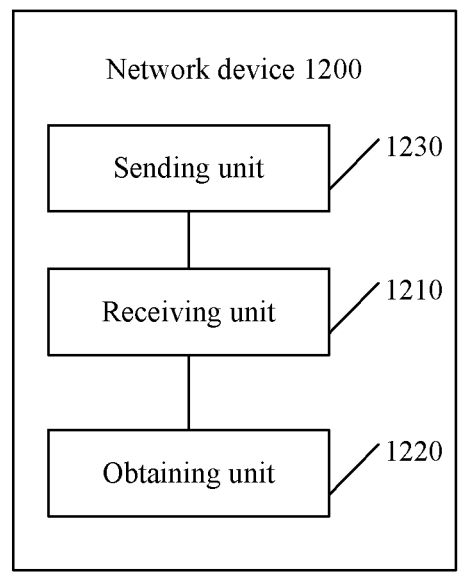
FIG. 12 is a schematic block diagram of a network device according to an embodiment of this application.

FIG. 10 is a schematic block diagram of a network device 1000 according to an embodiment of this application. As shown in FIG. 12, the network device 1000 includes a processor 1010, a memory 1020, a transceiver 1030, and a bus system 1040. The memory 1020 is configured to store a program instruction. The processor 1010 may invoke the program instruction stored in the memory 1020. The processor 1010, the memory 1020, and the transceiver 1030 are connected by using the bus system 1040.

The processor 1010 is configured to invoke the program instruction stored in the memory 1020, to perform the following operations: controlling the transceiver 1030 to obtain a received signal, where the received signal includes a pilot sequence of at least one terminal device, and the pilot sequence is a Reed-Muller sequence; and obtaining the pilot sequence of the at least one terminal device from the received signal.

Optionally, the pilot sequence is an order-2 Reed-Muller sequence generated according to a formula $$\phi_{p,b}(a) = \frac{1}{\sqrt{2^m}} i^{(2b+pb)^T a},$$

where a length of the pilot sequence is $2^m$ and m is a positive integer; p is a matrix of m rows and m columns; b is a vector of m rows; a is a bit vector with a length of m and consisting of 0s and 1s, has a total of $2^m$ possible values, and is corresponding to $2^m$ elements of the pilot sequence; and $i^2 = -1$.

Optionally, the processor 1010 is configured to invoke the program instruction stored in the memory 1020, to perform the following operation: controlling the transceiver 1030 to send first indication information to the terminal device, where the first indication information is used to indicate a length of a to-be-sent pilot sequence.

Optionally, the processor 1010 is configured to invoke the program instruction stored in the memory 1020, to perform the following operation: controlling the transceiver 1030 to send second indication information to the terminal device, where the second indication information is used to indicate a vector b set and/or a matrix p set, the vector b set is used by the terminal device to select the vector b, and the matrix p set is used by the terminal device to select the matrix p.

The processor 1010 is configured to invoke the program instruction stored in the memory 1020, to perform the following operations: detecting, based on a pilot sequence of each terminal device, data sent by the terminal device; and when the data is successfully decoded, controlling the transceiver 1030 to send an acknowledgment feedback message to the terminal device, or when the data is unsuccessfully decoded, controlling the transceiver 1030 to send a negative acknowledgment feedback message to the terminal device.

It should be understood that, the network device 1000 may be corresponding to the network device in the method 200, and may have the corresponding functions of the network device in the method 200. For brevity, details are not repeated herein.

Figure 11:
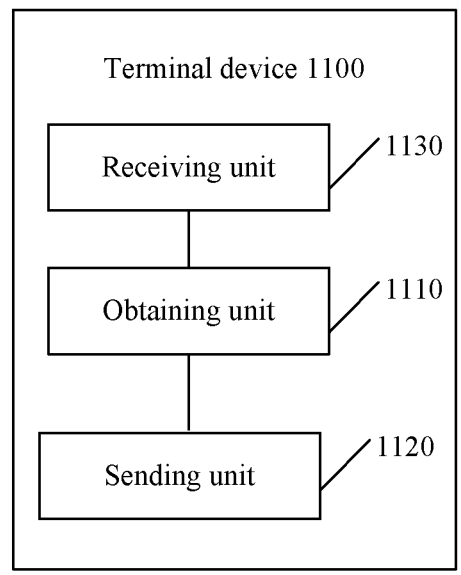
FIG. 11 is a schematic block diagram of a terminal device according to an embodiment of this application.
Figure 13:
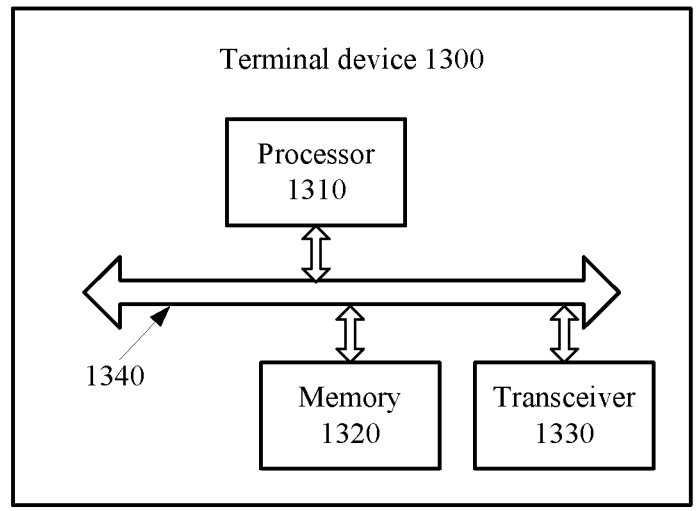
FIG. 13 is a schematic block diagram of a terminal device according to an embodiment of this application.

FIG. 11 is a schematic block diagram of a terminal device 1100 according to an embodiment of this application. As shown in FIG. 13, the terminal device 1100 includes: an obtaining unit 1110, configured to obtain a to-be-sent pilot sequence, where the to-be-sent pilot sequence is a sequence generated according to a formula $$\phi_{p,b}(a) = \frac{1}{\sqrt{2^m}} i^{(2b+pb)^T a},$$

where a length of the pilot sequence is $2^m$ and m is a positive integer; p is a matrix of m rows and m columns; b is a vector of m rows; a is a bit vector with a length of m and consisting of 0s and 1s, has a total of $2^m$ possible values, and is corresponding to $2^m$ elements of the pilot sequence; and $i^2 = -1$; and a sending unit 1120, configured to send the to-be-sent pilot sequence.

Optionally, the obtaining unit 1110 is configured to: obtain the to-be-sent pilot sequence from a pilot sequence set, where the pilot sequence set includes at least two sequences.

Optionally, the obtaining unit 1110 is specifically configured to: determine the length of the to-be-sent pilot sequence, where the length of the to-be-sent pilot sequence is $2^m$ and m is a positive integer; determine the matrix p of m rows and m columns and the vector b of m rows; and generate a sequence as the to-be-sent pilot sequence according to the formula $$\phi_{p,b}(a) = \frac{1}{\sqrt{2^m}} i^{(2b+pb)^T a}.$$

Optionally, as shown in FIG. 13, the terminal device 1110 further includes a receiving unit 1130, configured to receive first indication information sent by a network device, where the first indication information is used to indicate the length of the to-be-sent pilot sequence.

Optionally, the obtaining unit 1110 is specifically configured to: select the matrix p from a matrix p set corresponding to m; and select the vector b from a vector b set corresponding to m.

Optionally, the matrix in the matrix p set is a binary symmetric matrix whose diagonal consists of 0s, and each element of the matrix is 0 or 1; and/or the vector in the vector b set is a binary vector, and each element of the vector is 0 or 1.

Optionally, the obtaining unit 1110 is specifically configured to: generate a pilot index based on at least one of an identifier of the terminal device, a system frame number, a timeslot number, and a cell identifier; select, based on the pilot index, the matrix p from the matrix p set corresponding to m; and select, based on the pilot index, the vector b from the vector b set corresponding to m.

Optionally, as shown in FIG. 13, the terminal device 1110 further includes the receiving unit 1130, configured to receive second indication information sent by the network device, where the second indication information is used to indicate the matrix p set and/or the vector b set.

Optionally, the to-be-sent pilot sequence is used for user status detection.

Optionally, the sending unit 1120 sends the to-be-sent pilot sequence on partial bandwidth of available bandwidth.

It should be understood that, the terminal device 1100 may be corresponding to the terminal device in the method 400, and may have the corresponding functions of the terminal device in the method 400. For brevity, details are not repeated herein.

FIG. 12 is a schematic block diagram of a network device 1200 according to an embodiment of this application. As shown in FIG. 12, the network device 1200 includes a receiving unit 1210 and an obtaining unit 1220. The receiving unit 1210 is configured to obtain a received signal, where the received signal includes a pilot sequence sent by at least one terminal device, and the pilot sequence is a sequence generated according to a formula $$\phi_{p,b}(a) = \frac{1}{\sqrt{2^m}} i^{(2b+pb)^T a},$$

where a length of the pilot sequence is $2^m$ and m is a positive integer; p is a matrix of m rows and m columns; b is a vector of m rows; a is a bit vector with a length of m and consisting of 0s and 1s, has a total of $2^m$ possible values, and is corresponding to $2^m$ elements of the pilot sequence; and $i^2 = -1$. The obtaining unit 1220 is configured to obtain the pilot sequence sent by the at least one terminal device from the received signal.

Optionally, as shown in FIG. 12, the network device 1200 further includes a sending unit 1230, configured to send first indication information to the terminal device, where the first indication information is used to indicate a length of a to-be-sent pilot sequence.

Optionally, as shown in FIG. 12, the network device 1200 further includes the sending unit 1230, configured to send second indication information to the terminal device, where the second indication information is used to indicate at least one of a vector b set and a matrix p set, the vector b set is used by the terminal device to select the vector b, and the matrix p set is used by the terminal device to select the matrix p.

It should be understood that, the network device 1200 may be corresponding to the network device in the method 400, and may have the corresponding functions of the network device in the method 400. For brevity, details are not repeated herein.

FIG. 13 is a schematic block diagram of a terminal device 1300 according to an embodiment of this application. As shown in FIG. 13, the terminal device 1300 includes a processor 1310, a memory 1320, a transceiver 1330, and a bus system 1340. The memory 1320 is configured to store a program instruction. The processor 1310 may invoke the program instruction stored in the memory 1320. The processor 1310, the memory 1320, and the transceiver 1330 may be connected by using the bus system 1340.

The processor 1310 is configured to invoke the program instruction stored in the memory 1320, to perform the following operations: obtaining a to-be-sent pilot sequence, where the to-be-sent pilot sequence is a sequence generated according to a formula $$\phi_{p,b}(a) = \frac{1}{\sqrt{2^m}} i^{(2b+pb)^T a},$$

where a length of the pilot sequence is $2^m$ and m is a positive integer; p is a matrix of m rows and m columns; b is a vector of m rows; a is a bit vector with a length of m and consisting of 0s and 1s, has a total of $2^m$ possible values, and is corresponding to $2^m$ elements of the pilot sequence; and $i^2 = -1$; and controlling the transceiver 1330 to send the to-be-sent pilot sequence.

Optionally, the processor 1310 is configured to invoke the program instruction stored in the memory 1320, to perform the following operation: obtaining the to-be-sent pilot sequence from a pilot sequence set, where the pilot sequence set includes at least two sequences.

Optionally, the processor 1310 is configured to invoke the program instruction stored in the memory 1320, to perform the following operations: determining the length of the to-be-sent pilot sequence, where the length of the to-be-sent pilot sequence is $2^m$ and m is a positive integer; determining the matrix p of m rows and m columns and the vector b of m rows; and generating a sequence as the to-be-sent pilot sequence according to the formula $$\phi_{p,b}(a) = \frac{1}{\sqrt{2^m}} i^{(2b+pb)^T a}.$$

Optionally, the processor 1310 is configured to invoke the program instruction stored in the memory 1320, to perform the following operation: controlling the transceiver 1330 to receive first indication information sent by a network device, where the first indication information is used to indicate the length of the to-be-sent pilot sequence.

Optionally, the processor 1310 is configured to invoke the program instruction stored in the memory 1320, to perform the following operations: selecting the matrix p from a matrix p set corresponding to m; and selecting the vector b from a vector b set corresponding to m.

Optionally, the matrix in the matrix p set is a binary symmetric matrix whose diagonal consists of 0s, and each element of the matrix is 0 or 1; and/or the vector in the vector b set is a binary vector, and each element of the vector is 0 or 1.

Optionally, the processor 1310 is configured to invoke the program instruction stored in the memory 1320, to perform the following operations: generating a pilot index based on at least one of an identifier of the terminal device, a system frame number, a timeslot number, and a cell identifier; selecting, based on the pilot index, the matrix p from the matrix p set corresponding to m; and selecting, based on the pilot index, the vector b from the vector b set corresponding to m.

Optionally, the processor 1310 is configured to invoke the program instruction stored in the memory 1320, to perform the following operation: controlling the transceiver 1330 to receive second indication information sent by the network device, where the second indication information is used to indicate the matrix p set and/or the vector b set.

Optionally, the to-be-sent pilot sequence is used for user status detection.

Optionally, the processor 1310 is configured to invoke the program instruction stored in the memory 1320, to perform the following operation: controlling the transceiver 1330 to send the to-be-sent pilot sequence on partial bandwidth of available bandwidth.

It should be understood that, the terminal device 1300 may be corresponding to the terminal device in the method 400, and may have the corresponding functions of the terminal device in the method 400. For brevity, details are not repeated herein.

Figure 14:
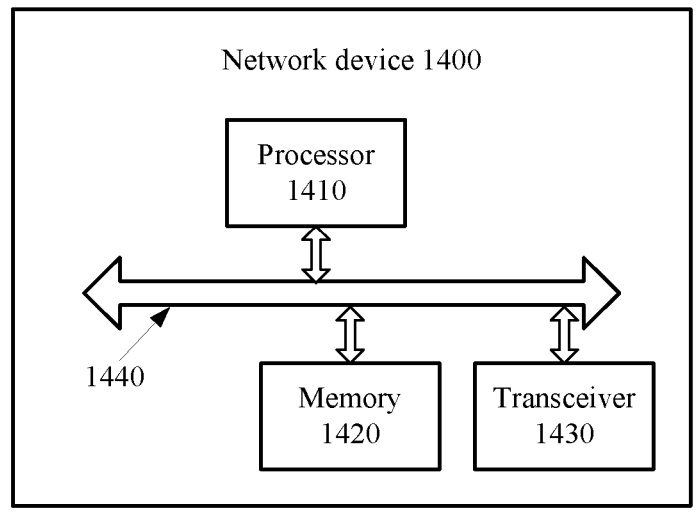
FIG. 14 is a schematic block diagram of a network device according to an embodiment of this application.

FIG. 14 is a schematic block diagram of a network device 1400 according to an embodiment of this application. As shown in FIG. 14, the network device 1400 includes a processor 1410, a memory 1420, a transceiver 1430, and a bus system 1440. The memory 1420 is configured to store a program instruction. The processor 1410 may invoke the program instruction stored in the memory 1420. The processor 1410, the memory 1420, and the transceiver 1430 may be connected by using the bus system 1440.

The processor 1410 is configured to invoke the program instruction stored in the memory 1420, to perform the following operations: controlling the transceiver 1430 to obtain a received signal, where the received signal includes a pilot sequence sent by at least one terminal device, and the pilot sequence is a sequence generated according to a formula $$\phi_{p,b}(a) = \frac{1}{\sqrt{2^m}} i^{(2b+pb)^T a},$$

where a length of the pilot sequence is $2^m$ and m is a positive integer; p is a matrix of m rows and m columns; b is a vector of m rows; a is a bit vector with a length of m and consisting of 0s and 1s, has a total of $2^m$ possible values, and is corresponding to $2^m$ elements of the pilot sequence; and $i^2 = -1$; and obtaining the pilot sequence sent by the at least one terminal device from the received signal.

Optionally, the processor 1410 is configured to invoke the program instruction stored in the memory 1420, to perform the following operation: controlling the transceiver 1430 to send first indication information to the terminal device, where the first indication information is used to indicate a length of a to-be-sent pilot sequence.

Optionally, the processor 1410 is configured to invoke the program instruction stored in the memory 1420, to perform the following operation: controlling the transceiver 1430 to send second indication information to the terminal device, where the second indication information is used to indicate at least one of a vector b set and a matrix p set, the vector b set is used by the terminal device to select the vector b, and the matrix p set is used by the terminal device to select the matrix p.

It should be understood that, the network device 1400 may be corresponding to the network device in the method 400, and may have the corresponding functions of the network device in the method 400. For brevity, details are not repeated herein.

The apparatus in the embodiments of this application may be a field-programmable gate array (FPGA), an application-specific integrated circuit (ASIC), a system on chip (SoC), a central processing unit (CPU), a network processor (NP), a digital signal processing circuit (DSP), a microcontroller unit (MCU), a programmable logic device (PLD), or another integrated chip.

A person of ordinary skill in the art may be aware that, units and algorithm steps in the examples described in combination with the embodiments disclosed in this specification may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for ease of description and brevity, for a detailed working process of the foregoing system, apparatus, and unit, reference may be made to a corresponding process in the foregoing method embodiments. Details are not repeated herein.

In the several embodiments provided in this application, it should be understood that, the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electrical, mechanical, or other forms.

The units described as separate parts may or may not be physically separate. Parts displayed as units may or may not be physical units, and may be located in one position or may be distributed on a plurality of network units. Some or all of the units may be selected depending on actual requirements to achieve the objectives of the solutions of the embodiments.

In addition, the functional units in the embodiments of this application may be integrated into one processing unit, or each of the units may exist alone physically, or at least two units may be integrated into one unit.

When the functions are implemented in a form of a software functional unit and sold or used as an independent product, the functions may be stored in a computer-readable storage medium. Based on such an understanding, the technical solutions of this application essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of this application. The foregoing storage medium includes any medium that can store program code, such as a USB flash drive, a removable hard disk, a read-only memory (ROM), a random access memory (RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An information transmission method, comprising:
generating, by a terminal device, a to-be-sent pilot sequence, wherein the to-be-sent pilot sequence is a Reed-Muller sequence; and
sending, by the terminal device, the to-be-sent pilot sequence; and, wherein
the to-be-sent pilot sequence is generated according to a Reed-Muller sequence generation formula,
wherein the to-be-sent pilot sequence is an order-2 Reed-Muller sequence generated according to a formula $$\phi_{P,b}(a) = \frac{1}{\sqrt{2^m}} i^{(2b+pb)^T a},$$

wherein
a length of the to-be-sent pilot sequence is $2^m$ and m is a positive integer;
p is a matrix of m rows and m columns;
b is a vector of m rows;
a is a bit vector with a length of m and consisting of 0s and 1s, has a total of $2^m$ possible values, and corresponds to $2^m$ elements of the pilot sequence; and
$i^2 = -1$.

2. The method according to claim 1, wherein obtaining, by the terminal device, the to-be-sent pilot sequence comprises:
determining the length of the to-be-sent pilot sequence, wherein the length of the to-be-sent pilot sequence is $2^m$;
determining the matrix p of m rows and m columns and the vector b of m rows; and
generating the order-2 Reed-Muller sequence as the to-be-sent pilot sequence according to the formula $$\phi_{P,b}(a) = \frac{1}{\sqrt{2^m}} i^{(2b+pb)^T a}.$$

3. The method according to claim 2, wherein the matrix p is a binary symmetric matrix.

4. A terminal device, comprising:
a processor, configured to generate a to-be-sent pilot sequence, wherein the to-be-sent pilot sequence is a Reed-Muller sequence; and
a transceiver, configured to send the to-be-sent pilot sequence; and,
wherein the to-be-sent pilot sequence is generated according to a Reed-Muller sequence generation formula,
wherein the to-be-sent pilot sequence is an order-2 Reed-Muller sequence generated according to a formula $$\phi_{P,b}(a) = \frac{1}{\sqrt{2^m}} i^{(2b+pb)^T a},$$

wherein
- a length of the pilot sequence is $2^m$ and m is a positive integer; p is a matrix of m rows and m columns;
- b is a vector of m rows;
- a is a bit vector with a length of m and consisting of 0s and 1s, has a total of $2^m$ possible values, and corresponds to $2^m$ elements of the pilot sequence; and
- $i^2=-1$.

5. The terminal device according to claim 4, wherein the processor is configured to:
- determine the length of the to-be-sent pilot sequence, wherein the length of the to-be-sent pilot sequence is $2^m$;
- determine the matrix p of m rows and m columns and the vector b of m rows; and
- generate the order-2 Reed-Muller sequence as the to-be-sent pilot sequence according to the formula $$\phi_{p,b}(a) = \frac{1}{\sqrt{2^m}} i^{(2b+pb)^T a}.$$

6. The terminal device according to claim 5, wherein the matrix p is a binary symmetric matrix.

7. The terminal device according to claim 5, wherein the processor is configured to:
- select the matrix p from a matrix p set corresponding to m; and
- select the vector b from a vector b set corresponding to m.

8. The terminal device according to claim 7, wherein:
- the transceiver is configured to receive second indication information sent by a network device, wherein the second indication information is used to indicate the matrix p set and the vector b set; and
- the processor is configured to: based on indication of the second indication information, select the matrix p from the matrix p set indicated by the second indication information, and select the vector b from the vector b set indicated by the second indication information.

9. A network device, comprising:
- a transceiver, configured to obtain a received signal comprising a pilot sequence of at least one terminal device, and the pilot sequence is a Reed-Muller sequence; and
- a processor, configured to obtain the pilot sequence from the received signal; and,
- wherein the pilot sequence is an order-2 Reed-Muller sequence generated according to a formula $$\phi_{p,b}(a) = \frac{1}{\sqrt{2^m}} i^{(2b+pb)^T a},$$

wherein
- a length of the pilot sequence is $2^m$ and m is a positive integer;
- p is a matrix of m rows and m columns; b is a vector of m rows;
- a is a bit vector with a length of m and consisting of 0s and 1s, has a total of $2^m$ possible values, and corresponds to $2^m$ elements of the pilot sequence;
- and $i^2=-1$.

10. The network device according to claim 9, wherein the transceiver is further configured to:
- send first indication information to the terminal device for indicating a length of a to-be-sent pilot sequence.

* * * * *